United States Patent
Wu et al.

(10) Patent No.: US 11,855,161 B2
(45) Date of Patent: Dec. 26, 2023

(54) SEMICONDUCTOR DEVICE CONTACT STRUCTURES AND METHODS OF FABRICATING THEREOF

(71) Applicant: Taiwan Semiconductor Manufacturing Company, Ltd., Hsinchu (TW)

(72) Inventors: I-Wen Wu, Hsinchu (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 173 days.

(21) Appl. No.: 17/444,068

(22) Filed: Jul. 30, 2021

(65) Prior Publication Data
US 2023/0034125 A1 Feb. 2, 2023

(51) Int. Cl.
| H01L 29/417 | (2006.01) |
| H01L 29/66 | (2006.01) |
| H01L 29/40 | (2006.01) |
| H01L 21/8234 | (2006.01) |

(52) U.S. Cl.
CPC .......... *H01L 29/41775* (2013.01); *H01L 21/823431* (2013.01); *H01L 29/401* (2013.01); *H01L 29/6681* (2013.01); *H01L 29/66545* (2013.01)

(58) Field of Classification Search
CPC ......... H01L 29/41775; H01L 29/66545; H01L 29/6681; H01L 29/401; H01L 21/823431
See application file for complete search history.

(56) References Cited

U.S. PATENT DOCUMENTS

| 9,252,233 | B2 | 2/2016 | Hsiao et al. |
| 9,721,897 | B1 | 8/2017 | Cheng et al. |
| 10,431,473 | B2 | 10/2019 | Ching et al. |
| 10,522,642 | B2 | 12/2019 | Lee et al. |
| 10,832,962 | B1 * | 11/2020 | Cheng ............... H01L 29/66545 |
| 2019/0181223 | A1 * | 6/2019 | Tang ................. H01L 29/66575 |
| 2020/0091309 | A1 * | 3/2020 | Lin ................... H01L 29/66545 |

* cited by examiner

*Primary Examiner* — Christine A Enad
(74) *Attorney, Agent, or Firm* — Haynes and Boone, LLP

(57) ABSTRACT

Methods and devices including an air gap adjacent a contact element extending to a source/drain feature of a device are described. Some embodiments of the method include depositing a dummy layer, which is subsequently removed to form the air gap. The dummy layer and subsequent air gap may be formed after a SAC dielectric layer such as silicon nitride is formed over an adjacent metal gate structure.

20 Claims, 32 Drawing Sheets

SEMICONDUCTOR DEVICE CONTACT STRUCTURES AND METHODS OF FABRICATING THEREOF

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices, such as fin field-effect transistors (FinFETs) and gate-all-around (GAA) transistors, have been introduced in an effort to improve gate control by increasing gate-channel coupling, reduce OFF-state current, and reduce short-channel effects (SCEs). The three-dimensional structure of the multi-gate devices, allows them to be aggressively scaled while maintaining gate control and mitigating SCEs. However, even with the introduction of multi-gate devices, aggressive scaling down of IC dimensions has resulted in densely spaced gate structures and source/drain contacts. Formation of gate contacts and source/drain contact vias to these densely packed gate structures and source/drain contacts presents demands high overlay precisions as misalignment may cause electrical shorts, leakage or increased parasitic capacitance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
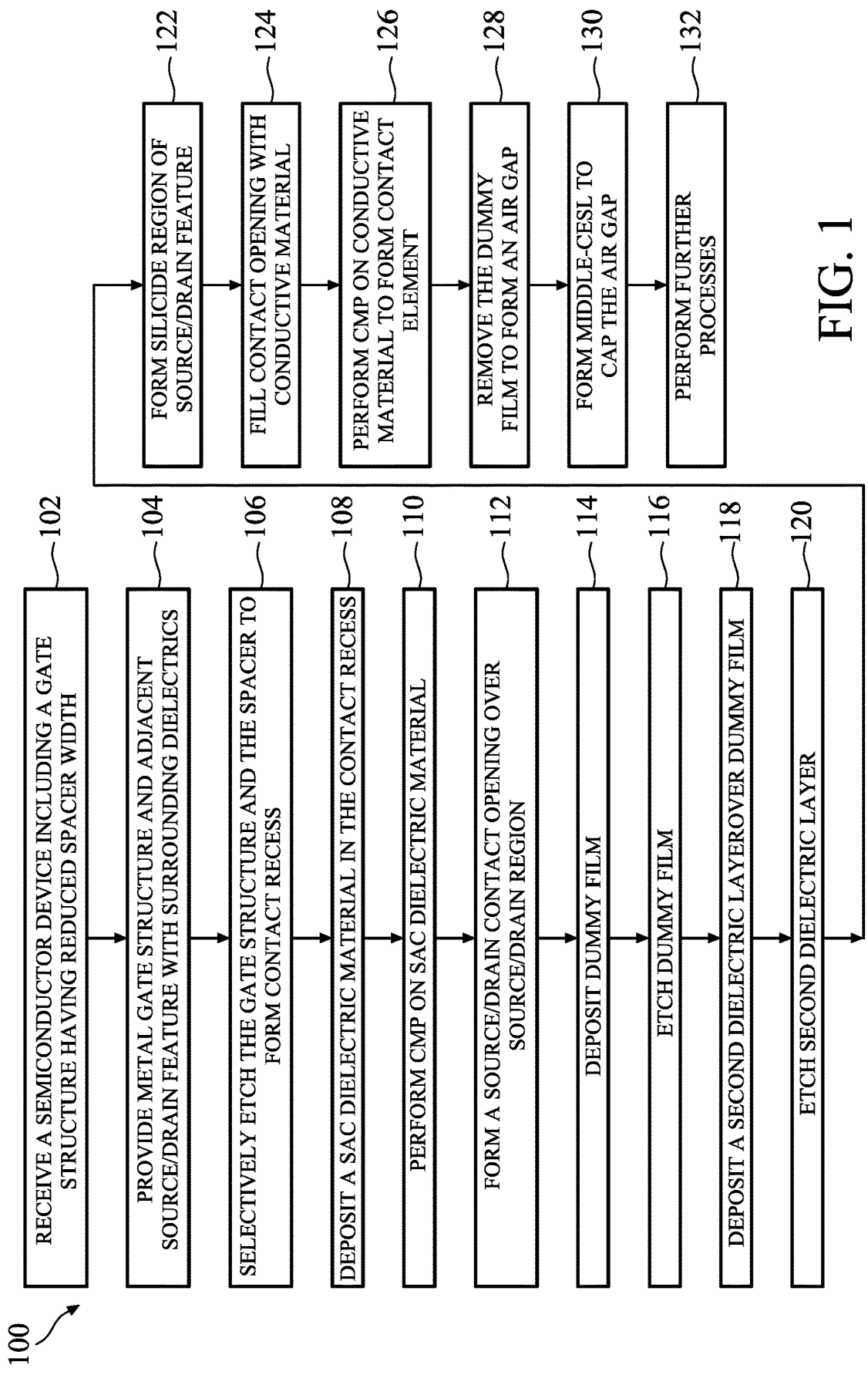
FIG. 1 is a flowchart of an embodiment of a method including forming a contact to a source/drain region of a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

This application relates to semiconductor devices and methods of forming the same. Particularly, this application relates to contact structures and methods of fabricating thereof. The contact structures may be self-aligned contact structures. Methods of the present disclosure include providing sufficient opening between adjacent gate structures to form a contact structure to the source/drain feature interposing the gate structures. For example, in some embodiments, providing a reduced thickness spacer structure allows for sufficient space between structures to provide insulation between the contact structure to the source/drain feature and the adjacent gate structure. In some embodiments, the insulation includes an air gap formed between the contact structure to the source/drain feature and the gate structure. The air gap between the contact structure and the gate structure can allow for parasitic capacitance reduction.

Some embodiments of the method steps below can provide for formation of the air gap while maintaining contact structure profile control.

Figure 2:
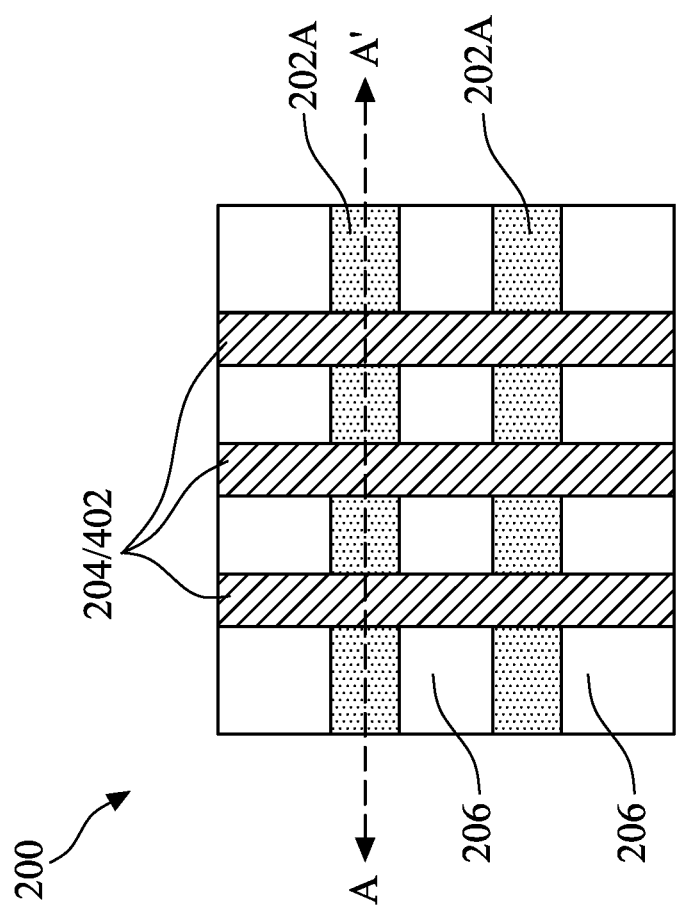
FIG. 2 is a fragmentary top view of a semiconductor device corresponding to the various stages illustrated with the following fragmentary cross-sectional views in accordance with some embodiments.
Figure 20:
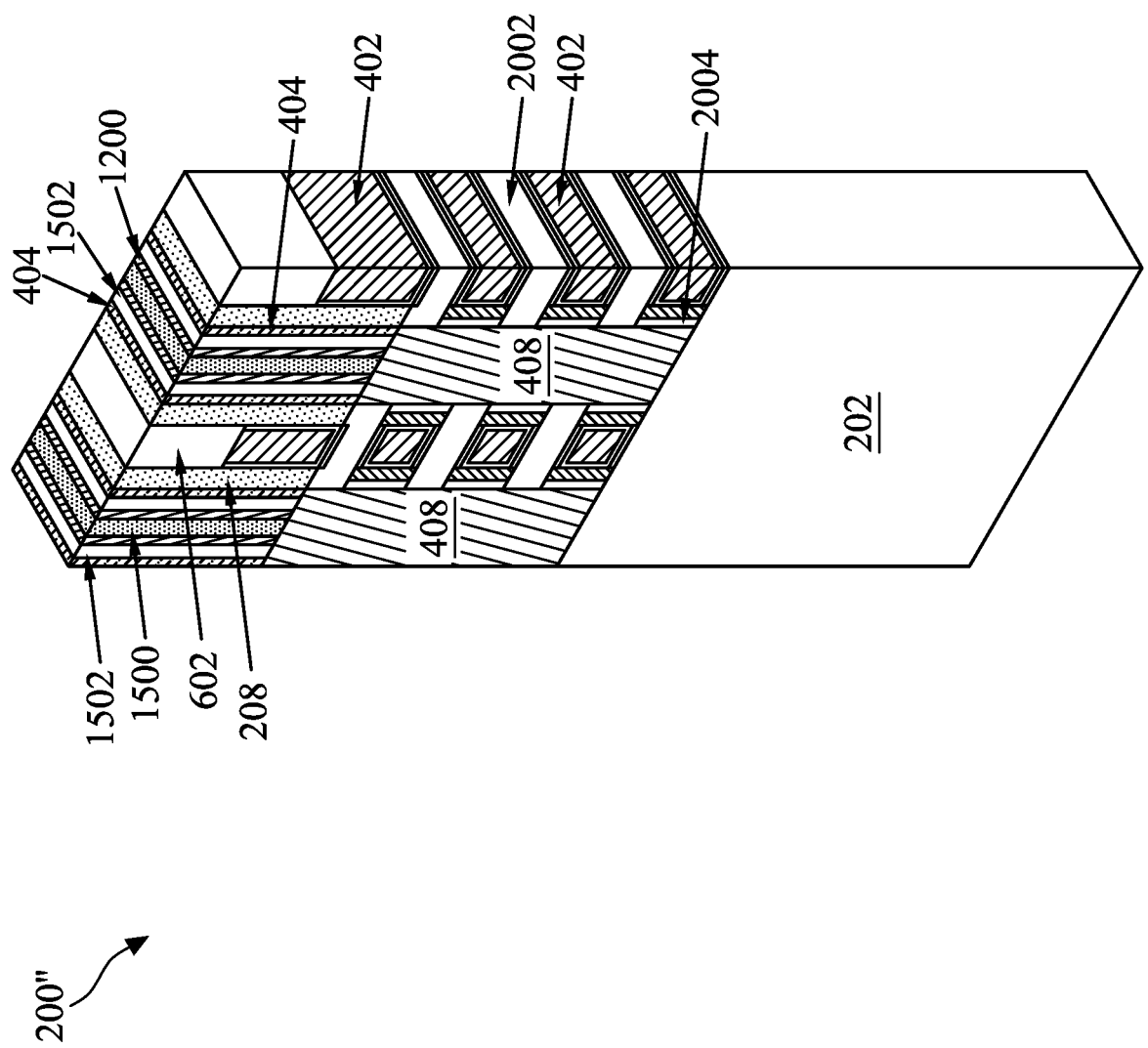
FIG. 20 is a fragmentary perspective view of an embodiment of a gate all around (GAA) device that may be fabricated according to one or more aspects of the present disclosure.

Referring now to FIG. 1, illustrated is a method 100 for fabricating a semiconductor device having a contact structure according to one or more aspects of the present disclosure. In some examples, a device 200 is provided, a top view of which is illustrated in FIGS. 2 and 17, and fragmentary cross-sectional views of which are illustrated in FIGS. 3A and 4, 5, 6, 7, 8A, 9A, 10A, 11A, 12A, 13A, 14A, 15A, and 16A. In some examples, a device 200' is provided, which is substantially similar to the device 200 except with differences as noted herein. The device 200' is illustrated by FIGS. 2-7, 8B, 9B, 10B, 11B, 12B, 13B, 14B, 15B, and 16b. Yet another embodiment of a device that may be fabricated using the method 100 is illustrated in FIG. 20.

Method 100 is exemplary and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Besides what are explicitly shown in figures of the present disclosure, the semiconductor device 200 may include additional transistors, bipolar junction transistors, resistors, capacitors, diodes, fuses, etc. Throughout the present disclosure, like reference numerals denote like features unless otherwise excepted or described.

The method 100 begins at block 102 where a semiconductor structure or device including a gate structure having spacer elements disposed on sidewalls of the gate structure. Referring to the example of FIGS. 3A, 3B, a device 200 is illustrated having a gate structure 204 with spacer elements 208 disposed on the sidewalls of the gate structure 204 disposed on a substrate 202.

The substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, in some embodiments, the substrate 202 may include an epitaxial layer (epi-layer), the substrate 202 may be strained for performance enhancement, the substrate 202 may include a silicon-on-insulator (SOI) structure, and/or the substrate 202 may have other suitable enhancement features.

The substrate 202 includes an active region 202A which similarly may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The active region 202A as illustrated may be referred to as a "fin" typical of FinFET devices in some embodiments and thus, referred to as fin structure 202A. As shown in FIG. 2, the fin structure 202A extends lengthwise along the X direction, while gate structures 204 extend along the Y direction. The fin structure 202A may be fabricated using suitable processes including photolithography and etch processes. The photolithography process may include forming a photoresist layer overlying the substrate 202, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The masking element may then be used to protect regions of the substrate 202 while a fin structure 202A. The recesses may be etched using a dry etch (e.g., chemical oxide removal), a wet etch, and/or other suitable processes. Numerous other embodiments of methods to form the fin structure 202A on the substrate 202 may also be used.

In some embodiments, the device 200 may be a GAA transistor and the active region 202A is a nanostructure of a GAA transistor. The active region 202A may include first semiconductor layers and second semiconductors layer that are first alternatingly and epitaxially grown on the substrate 202 to form a layer stack. The first semiconductor layer and the second semiconductor layer have different compositions (e.g., Si, SiGe). The semiconductor layer stack having first semiconductor nanostructures and second semiconductor nanostructures is then patterned to form fin-shape stacks of nanostructures. Alternating semiconductor layers in the channel regions of fin-shape stacks are then selectively removed to release the first semiconductor layers into suspended nanostructures forming a channel region.

Figure 3A:
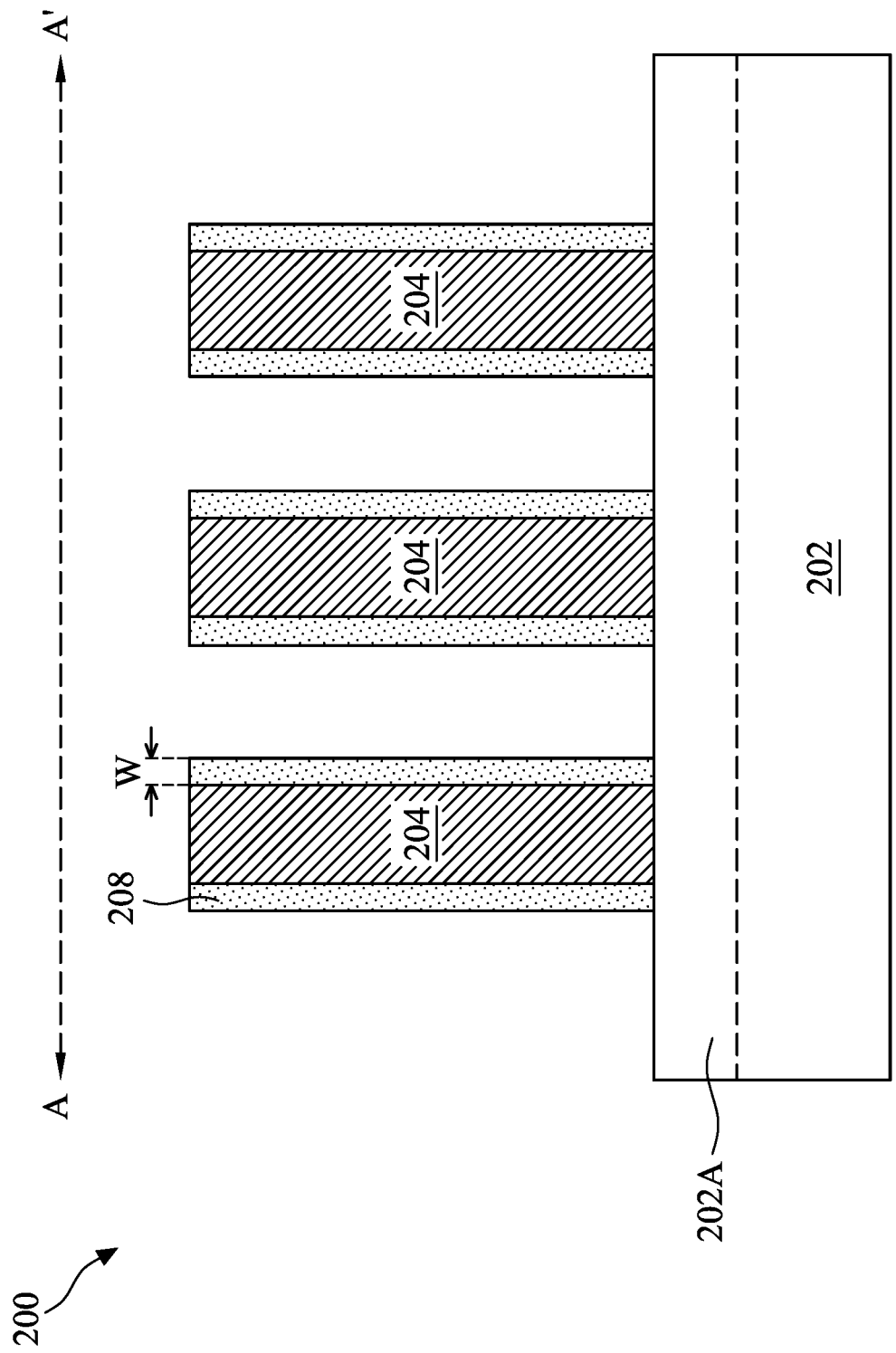
FIGS. 3A, 4, 5, 6, 7, 8A, 9A, 10A, 11A, 12A, 13A, 14A, 15A, 16A, 17A, and 18A are fragmentary cross-sectional views of an embodiment of a semiconductor device at various stages of fabrication according to the method in FIG. 1, according to one or more aspects of the present disclosure.
Figure 3B:
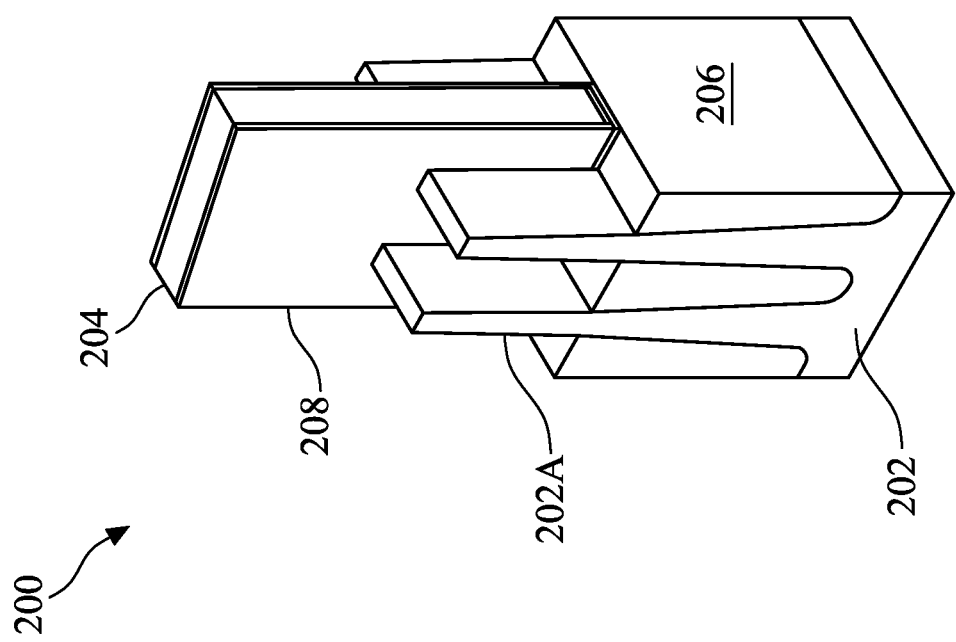
FIG. 3B is a perspective view of an embodiment corresponding to FIG. 3A.

Isolation features 206, also referred to as shallow trench isolation (STI) features, are formed interposing the fin structures 202A as illustrated in FIG. 3B. The isolation features may include dielectric material is first deposited over the substrate 202, filling the trenches between the fin structures 202A with the dielectric material. In some embodiments, the dielectric material may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, or other suitable process. The isolation features 206 may include a multi-layer structure. In some embodiments, a field oxide, a LOCOS feature, and/or other suitable isolation features may additionally or alternatively be implemented on and/or within the substrate.

Gate structures 204 are formed over the fin structure 202A. In an embodiment, the gate structure as formed is a dummy gate. In an embodiment, the formation of the gate structure includes forming a gate dielectric layer(s) and gate electrode layer(s), one or more of said layers being sacrificial. That is, in some embodiments, the gate structure 204 is sacrificial, or in other words, is a dummy gate that is subsequently replaced by a functional gate (e.g., gate 402 discussed below). The gate structure 204 may include an interfacial layer, a gate dielectric layer, and an electrode layer. In some embodiments, one or more of the interfacial layer, the gate dielectric layer, and/or the electrode layer are formed conformally over the fin structures, including within trenches between adjacent fin elements 202A (e.g., over isolation features 206) and subsequently patterned. In some embodiments, the electrode layer may include polycrystalline silicon (polysilicon).

The spacer elements 208 are formed by deposition of a conformal spacer material layer is deposited over the substrate 202 including over the gate structure 204. The spacer material layer may be formed by chemical oxidation, thermal oxidation, ALD, CVD, and/or other suitable method. The spacer material layer may, after conformal deposition, be etched back for example exposing a top of the gate 204

(e.g., a hard mask layer of the gate structure 204) to form gate spacers 208. The gate spacers 208 may be a multi-layer structure. The gate spacers 208 may include a dielectric material such as silicon oxide, silicon nitride, silicon oxycarbide, aluminum oxide, silicon carbide, silicon oxynitride, SiOC, SiOCN, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride, other low-K dielectric materials, or combinations thereof. The width of the spacer elements 208 have a width w between 3 and 6 nanometers (nm). In an embodiment, the width of the spacer element is less than 3 nm, such as 1.5 nm.

In some embodiments, the spacer material is deposited and etched back to form a spacer element 208 of the first width, and that width is maintained through blocks 104 and 106, discussed below. In a further embodiment, the first width is w. In other embodiments, the spacer material is deposited and etched back to form a spacer element 208 of an initial thickness w0, and then a second, subsequent etching process is performed to obtain the first width w of between 3 and 6 nm. In a further embodiment, the initial thickness w0 is between approximately 6 and 12 nm. In some embodiments, the spacer elements 208 are formed of multiple spacer layers, where one spacer is subsequently removed to form the spacer elements of the first width w between 3- and 6 nm. In embodiments providing a subsequent etch back such as from an initial thickness w0 to w, the thinning of the spacer can occur before or after the source/drain features have been formed. For example, the initial width of the spacer layers can define the source/drain positioning with respect to the channel region and/or provide sidewalls for subsequent processes (e.g., replacement gate), which is subsequently thinned. The provision of the spacer at width w is provided prior to the deposition of surrounding dielectrics such as the CESL and ILD discussed below. Thus, in some embodiments, an etching process that reduces the spacer element width by approximately 40-70% may be performed prior to depositing contact etch stop layer and/or interlayer dielectric (ILD) discussed below. An increased width w reduces the structure spacing in which the dielectric layers (e.g., CESL and ILD) are to be formed making the gap fill more difficult. In contrast, a width w that is too small may provide insufficient support for the gate formation discussed below.

After providing the device having the gate structure (e.g., dummy gate), the method 100 then proceeds to block 104 where fabrication of the device continues to provide a metal gate structure and adjacent source/drain features with surrounding dielectric layers. Again, as discussed above, in an embodiment prior to forming the metal gate structure, the spacer elements formed on the initial (e.g., dummy) gate structure can be reduced in thickness, for example, after the formation of the source/drain features.

Figure 4:
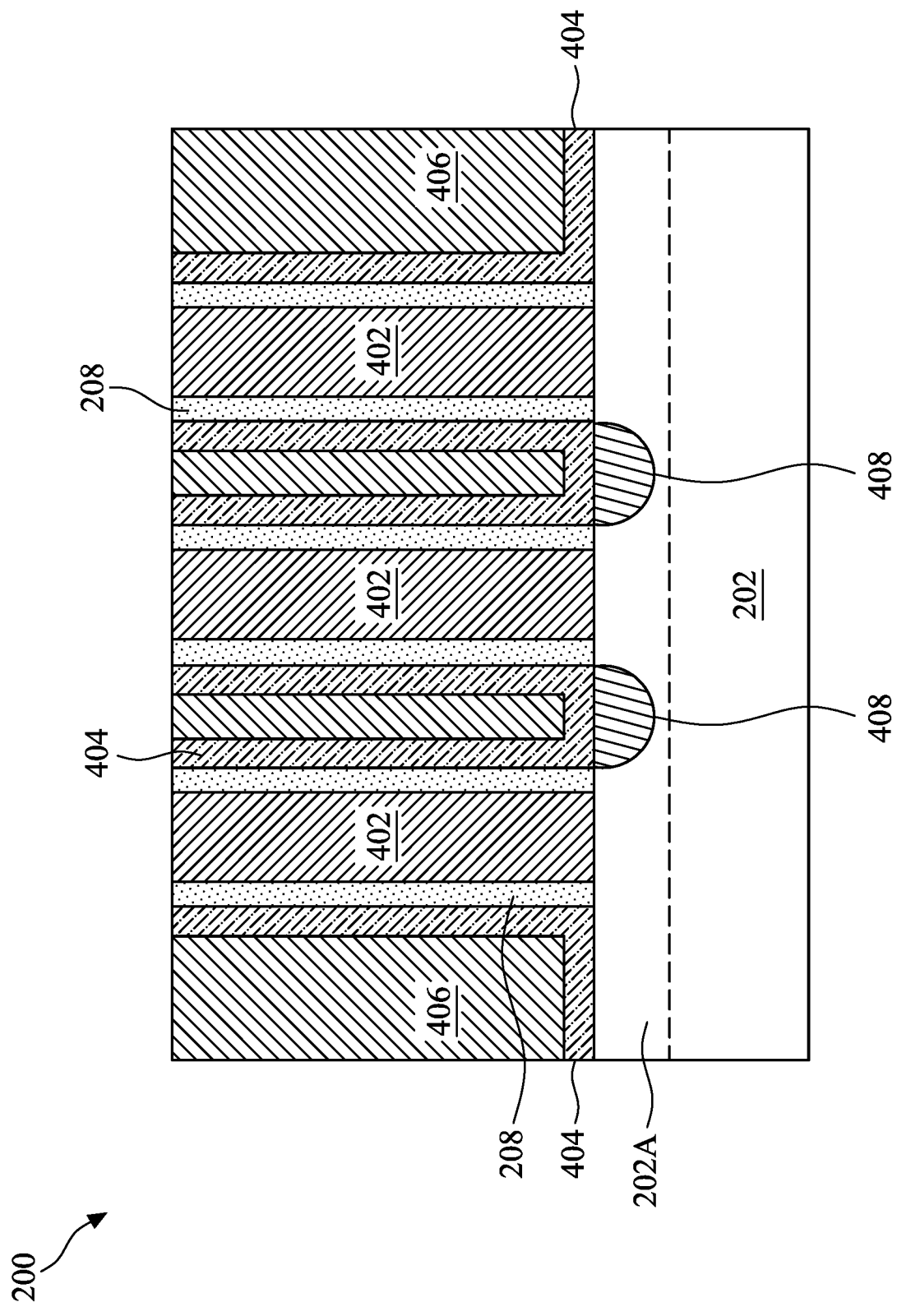
Figure 5:
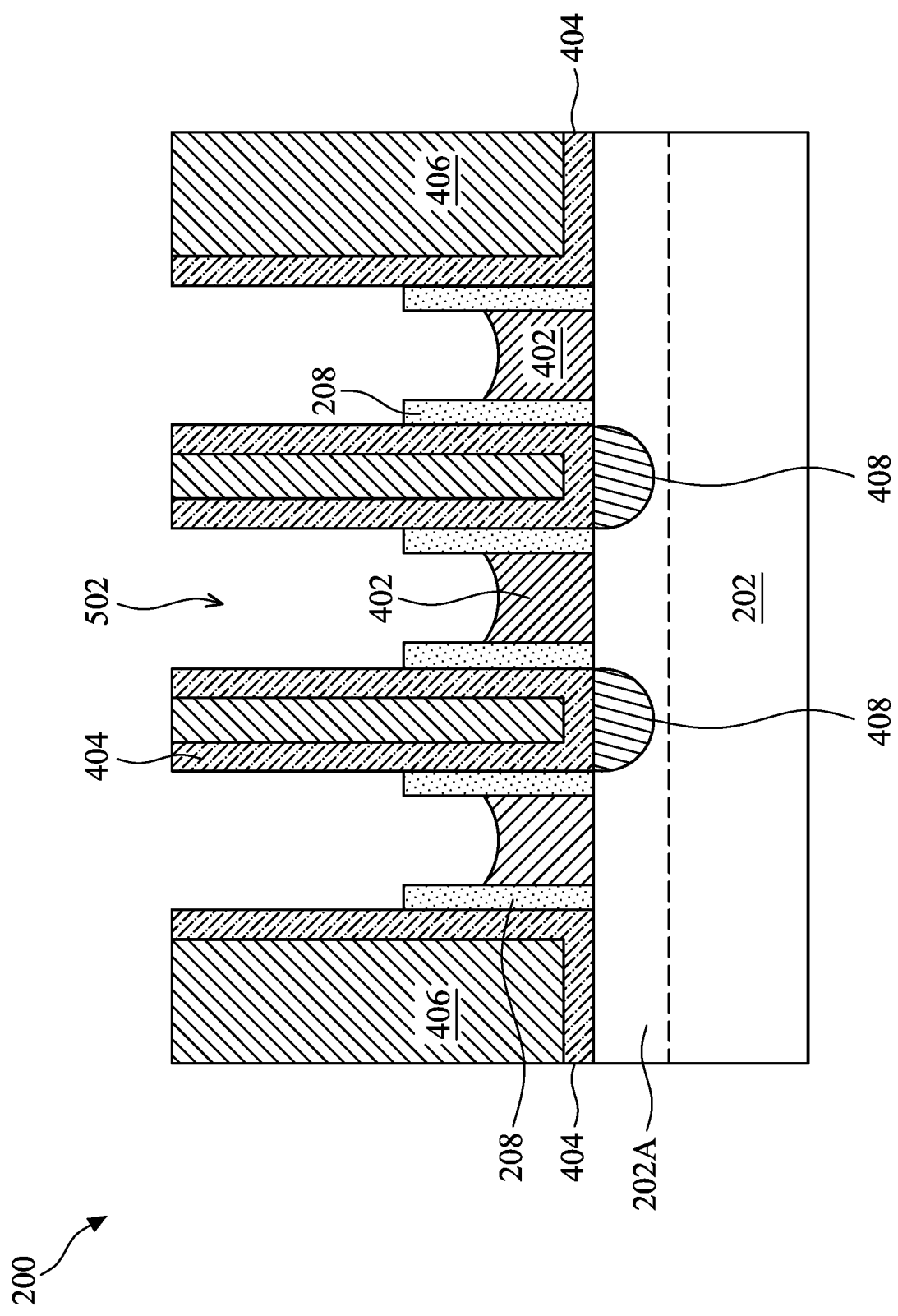
Figure 6:
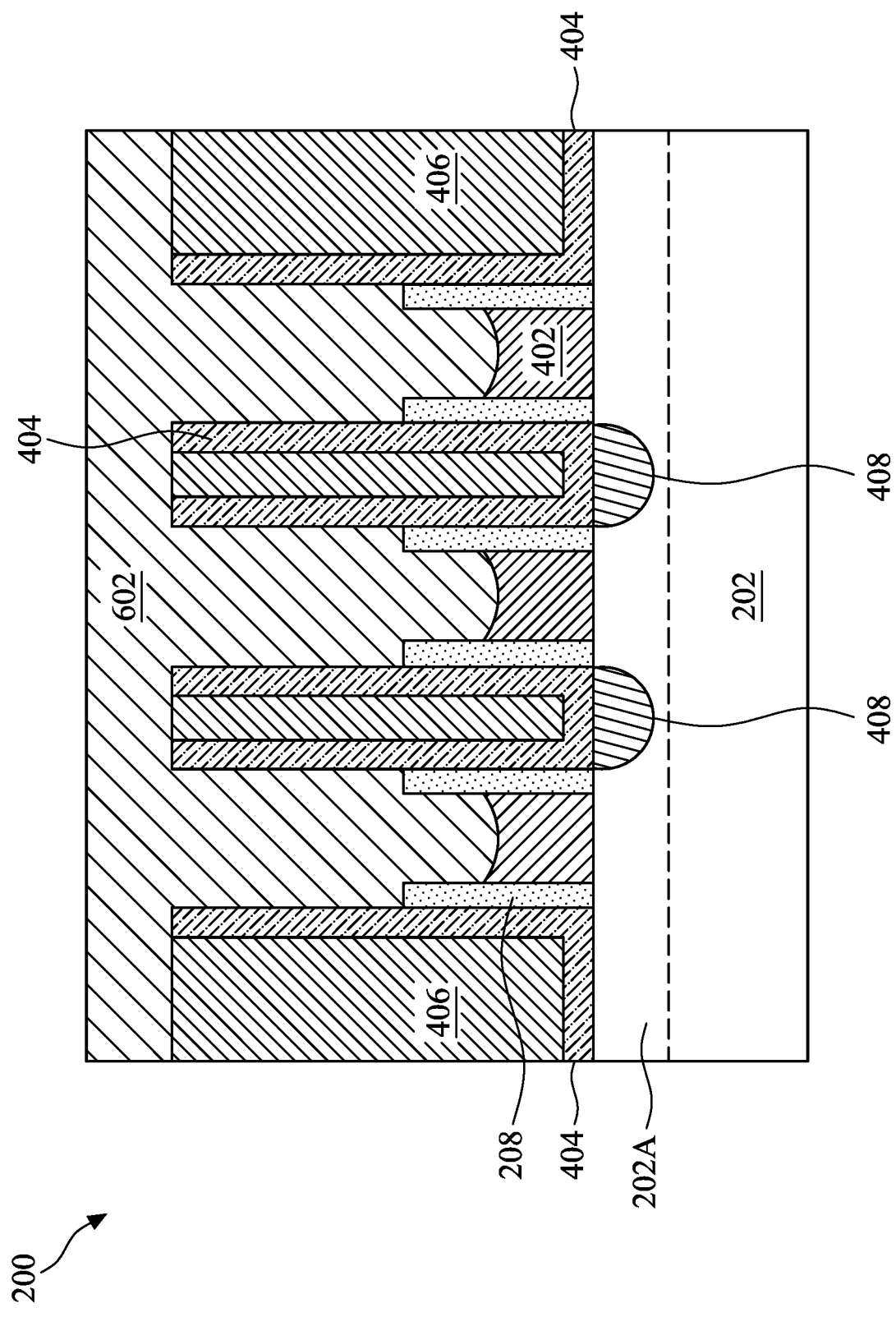

The device 200 progressed in fabrication stages indicated by block 104 is illustrated by the example cross-sectional view of FIG. 4. As illustrated in the example device 200 of FIG. 4, the gate structure 204 of FIGS. 3A and 3B has been replaced with the gate structure 402, which includes a metal gate electrode as discussed below. Source/drain features 408 have been formed in the active region of the fin structure 202A. Dielectric layers, including contact etch stop layer 404 and inter layer dielectric (ILD) 406 are formed adjacent the gate structure 402. The spacer elements 208 may have a thickness w as shown and discussed above and in FIG. 3B.

The gate structure 402 may include an interfacial layer, a gate dielectric layer, and a gate electrode. In some embodiments, a hard mask layer may overlie the gate electrode. In some embodiments, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer may include silicon oxide of other compositions including high-k dielectric materials such as hafnium oxide ($HfO_2$), HfZrO, $TiO_2$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layer may be formed by chemical oxidation, thermal oxidation, atomic layer deposition (ALD), chemical vapor deposition (CVD), ALD, physical vapor deposition (PVD), and/or other suitable methods. In some embodiments, the gate electrode may include a metal gate electrode layer may be formed including Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. The electrode layer may provide an N-type or P-type work function, for example, depending on whether an N-type or P-type FinFET is being formed. In various embodiments, the electrode layer may be formed by ALD, PVD, CVD, e-beam evaporation, or other suitable process.

In some cases, prior to the replacement of the gate structure to from gate structure 402, source/drain features 408 are formed. The source/drain features 408 may be epitaxially grown and suitably doped to provide the relevant type of conductivity (n-type or p-type). In various embodiments, the semiconductor material layer grown to form the source/drain features 408 may include Ge, Si, GaAs, AlGaAs, SiGe, GaAsP, SiP, SiC, or other suitable material. The source/drain features 408 may be formed by one or more epitaxial (epi) processes. In some embodiments, the source/drain features 408 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 408 are not in-situ doped, and instead an implantation process is performed to dope the source/drain features 408. In some embodiments, formation of the source/drain features 408 may be performed in separate processing sequences for each of N-type and P-type source/drain features.

In some embodiments, source/drain features 408 are formed after a portion of the fin structure 202A is recessed in the source/drain regions. The source/drain features 408 are formed on a seed area provided at a top surface of the recessed fin 202A. In some embodiments, a bottom of the source/drain feature 408 interfaces a top surface of the recessed region of the fin 202A of the substrate.

Referring to the example of FIG. 4, in an embodiment of block 104, a CESL 404 and an ILD layer 406 are formed over the substrate 202. The ILD layer 406 may be disposed over the CESL 404. In some examples, the CESL 404 includes a silicon nitride layer. Other example compositions include silicon oxide, a silicon oxynitride, and/or other materials known in the art. The CESL 404 may be formed by CVD, ALD, or other suitable process. In some embodiments, the ILD layer 406 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, and/or other suitable dielectric materials. The ILD layer 406 may be deposited by CVD, ALD, or other suitable process. In some embodiments, the CESL 404 may be omitted. In an embodiment, the CESL 404 has a thickness of approximately 1-10 nm.

The material for the spacer elements 208 is selected such that the spacer elements 208 and the CESL 404 have different etching selectivity. That is, the selection of materials allows each of the spacer element 208 to be selectively etched without substantially damaging the CESL 404. In an embodiment, the spacer elements are a low-k dielectric (such as TEOS, un-doped silicate glass, BPSG, FSG, PSG, BSG, fluorine-doped silicon dioxide, carbon-doped silicon dioxide, porous silicon dioxide, porous carbon-doped silicon dioxide, spin-on silicon based polymeric dielectrics) and the CESL 404 is silicon nitride.

The method 100 then proceeds to block 106 to selectively etch the gate structure and the spacer elements to form a contact recess. Referring to the example of FIG. 5, a recess 502 is formed. In some embodiments, the etch process is selective such that it etches the gate structure 402 and the spacer elements 208 without substantially etching the CESL 404. The etch process at block 106 may include a dry etch, a wet dry, a combination thereof, or other suitable etch process. In some implementations, the etching process at block 106 includes at least one component that etches the gate structure 402 at a greater than rate than it etches the spacer element 208 such that a top surface of the gate structure 402 is lower than a top surface of the spacer element 208. In some embodiments, additional processing of the gate structure such as forming a silicide region at the top portion of the gate structure is performed.

The method 100 then proceeds to block 108 where a dielectric layer, referred to in some examples as first self-aligned capping dielectric (SAC) material, is deposited in the recess formed in block 106. Referring to the example of FIG. 6, the dielectric layer (also referred to SAC material) 602 is deposited over the substrate 202 and in the recesses 502. In some embodiments, the dielectric materials 602 may be deposited using high-density-plasma CVD (HDPCVD), plasma enhanced CVD (PECVD), atomic layer deposition (ALD), or a suitable deposition process. In an embodiment, the dielectric material 602 is silicon nitride. Other exemplary compositions of the dielectric material 602 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zirconium oxide, zinc oxide, tantalum oxide, lanthanum oxide, yttrium oxide, tantalum carbonitride, silicon oxycarbonitride, silicon, zirconium nitride, silicon carbonitride or combinations thereof. In an embodiment, the material of the dielectric layer 602 is the same composition as CESL 404.

The method 100 then proceeds to block 110 where the SAC dielectric material deposited in block 108 is planarized for example by a chemical mechanical polish (CMP) process. Referring to the example of FIG. 7, the surface is planarized removing portions of the dielectric layer 602, the ILD 406, and/or the CESL 404.

Figure 7:
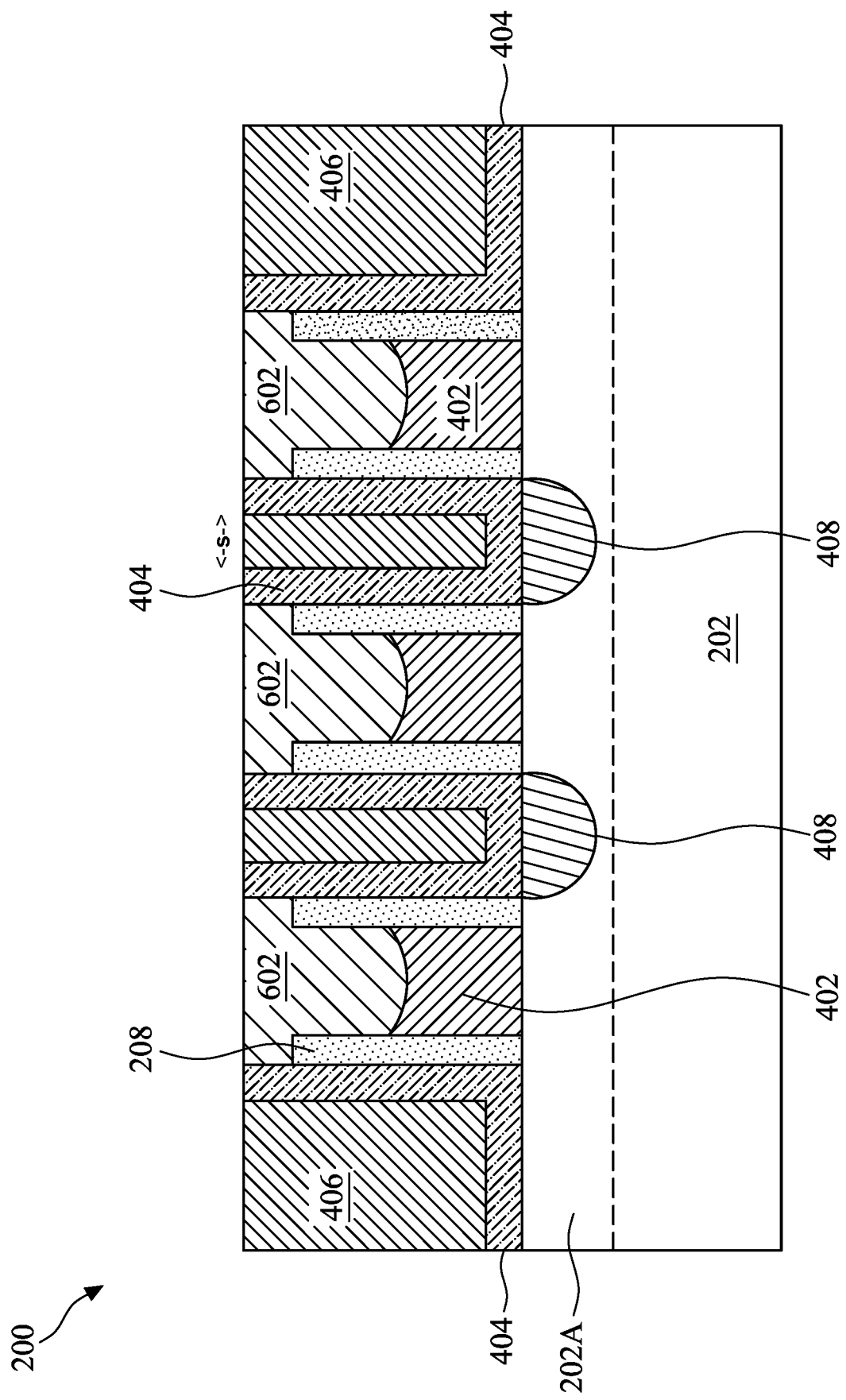

The device 200 of FIG. 7 is also illustrative of spacing "s" between adjacent gate structures 402 having the spacer elements 208 and the CESL 404 formed thereon. In some embodiments, the spacing "s" is between approximately 8 to 30 nm. In an embodiment, the width of the gate structure 402 is between approximately 10 nm-30 nm. In an embodiment, the ratio of spacing "s" to the gate 402 width is approximately 1:0.5-1.5. In an embodiment, the ratio of spacing "s" to the thickness of the CESL 404 and the spacer elements 208 are 1:0.15:0.07.

The method 100 then proceeds to block 112 where a source/drain contact opening is formed over the source/drain region. Referring to the example of FIG. 8A, a patterned masking element 802 is formed over the substrate 202 having an opening 804 over source/drain features 408. The masking element 802 may include a hard mask layer formed of silicon oxide, silicon nitride, or other suitable dielectric material. The masking elements 802 may be a single layer or a multi-layer. In an embodiment, the masking element 802 also includes or is formed by a photoresist layer. A photolithography process may be used to form the masking element may include forming a photoresist layer over a hard mask layer on the device 200 and exposing the resist to a pattern, performing post-exposure bake processes, and developing the resist to form a masking element including the resist. In some embodiments, pattering the resist to form the masking element may be performed using an electron beam (e-beam) lithography process. The masking element (or portions thereof, such as the hard mask layer) may then be used to protect regions of the device 200, while the opening 804 is over the source/drain features 408.

Figure 9A:
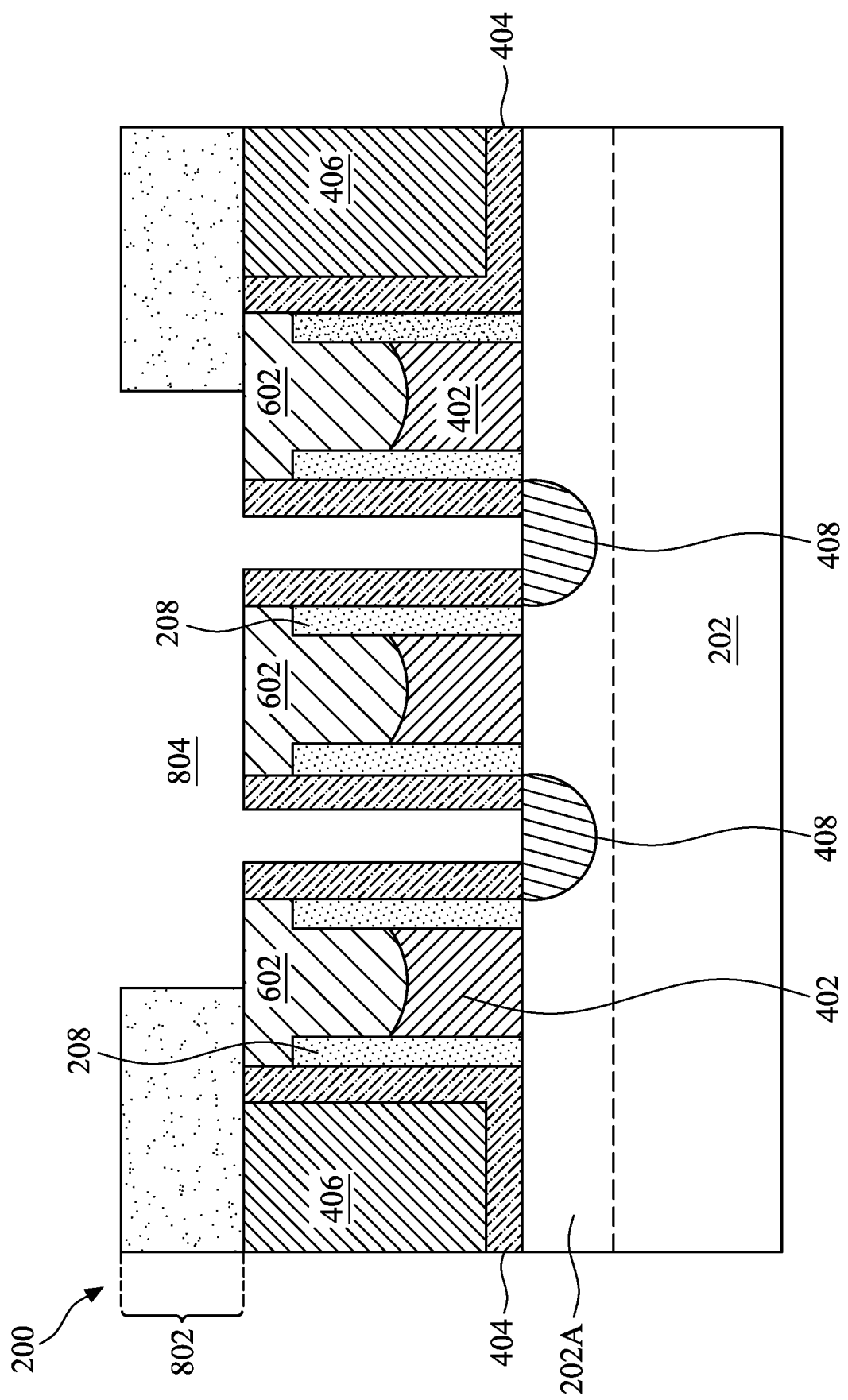
Figure 9B:
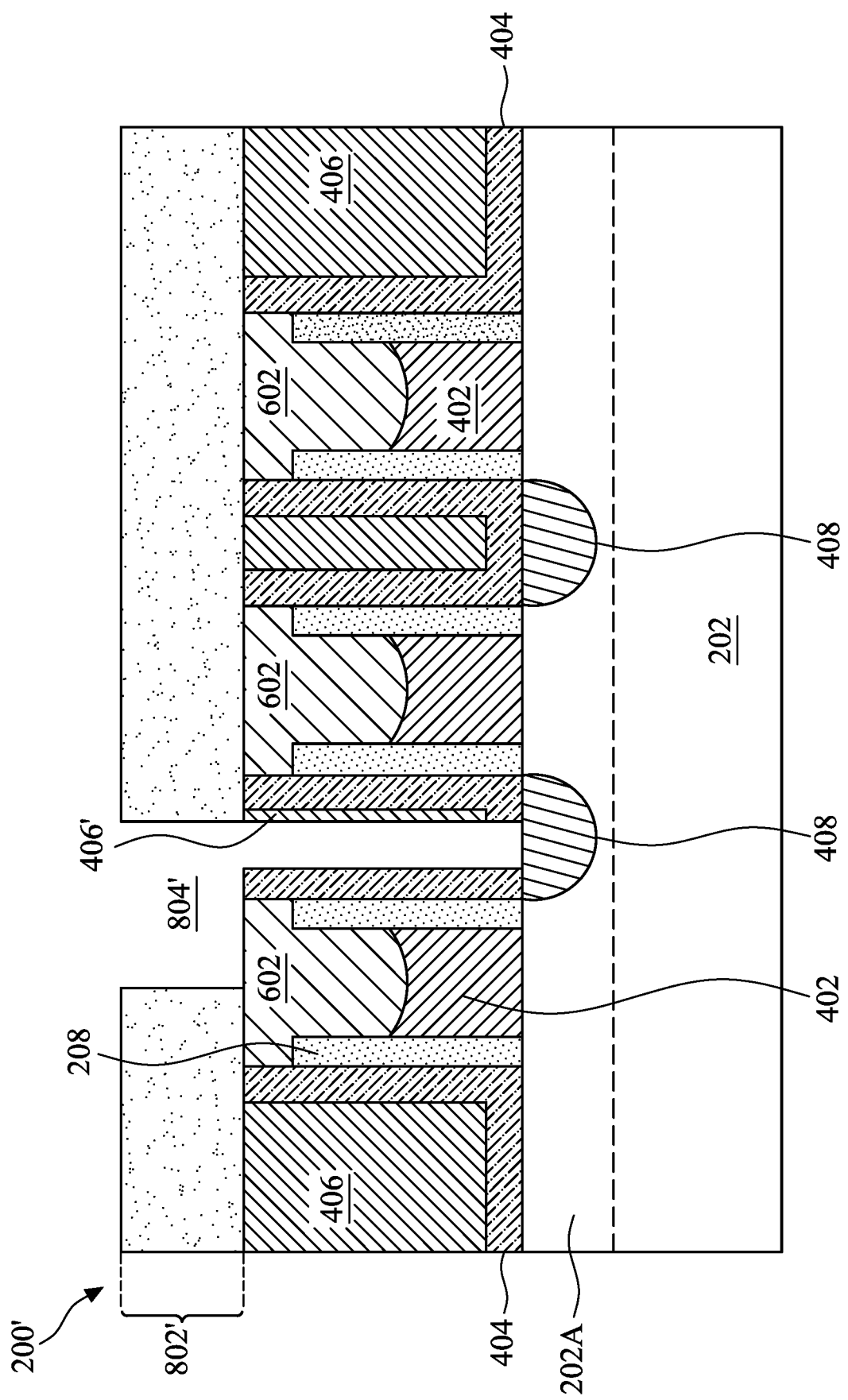

Referring now to FIG. 9A, the device 200 is then etched while using the patterned masking element 802 as an etch mask. As shown in FIG. 9A, the etching selectively removes the ILD layer 406 underlying the opening 804 to form source/drain contact openings 902 over and exposing the source/drain features 408. The source/drain contact openings 902 expose top surfaces of source/drain features in, on, or over the active region 202A. The etching of the openings 902 has a selectivity such that the etchant substantially does not etch the composition of the CESL 404 and the SAC layer 602. The masking element 802 may be subsequently removed.

Figure 10A:
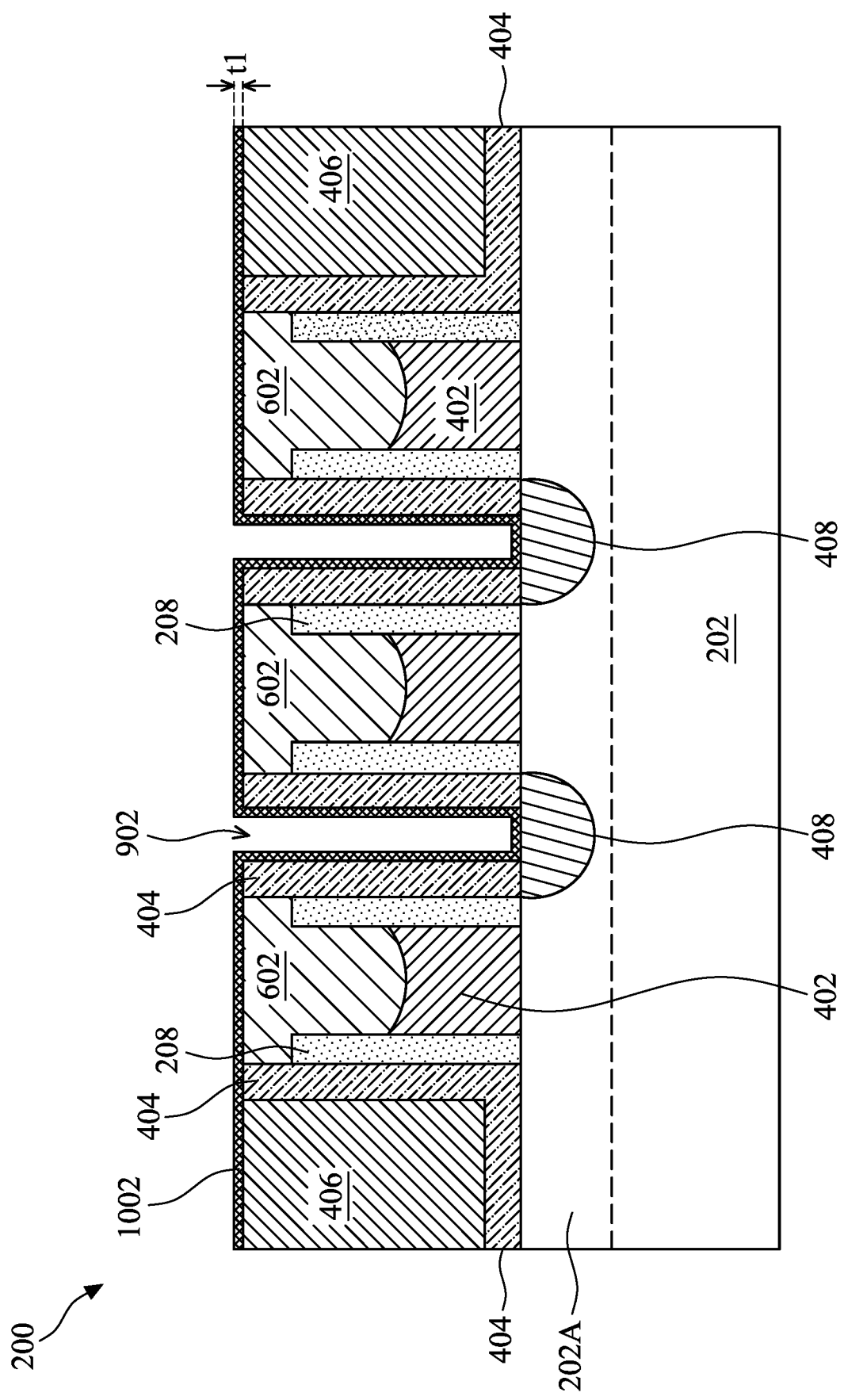
Figure 10B:
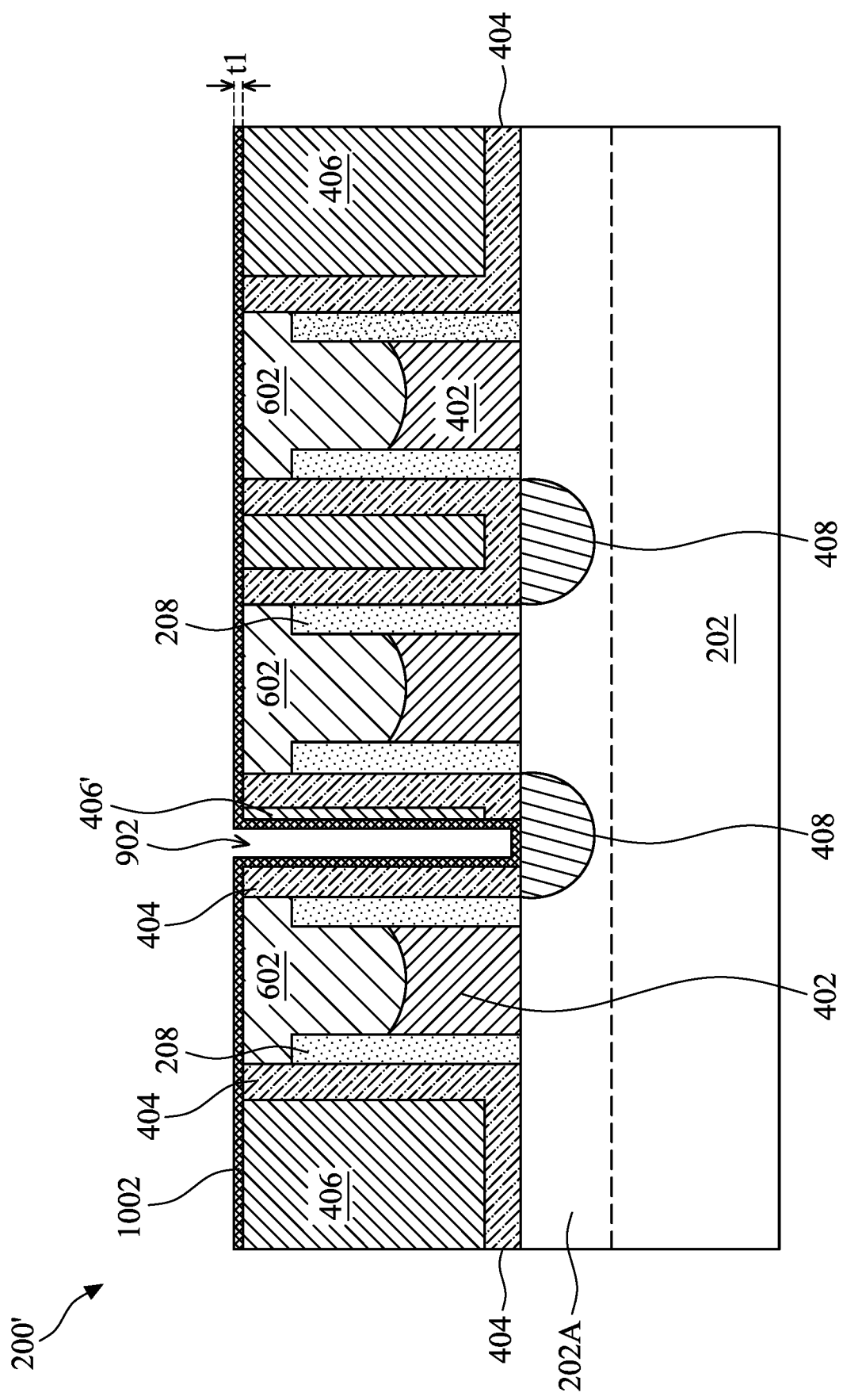
Figure 11A:
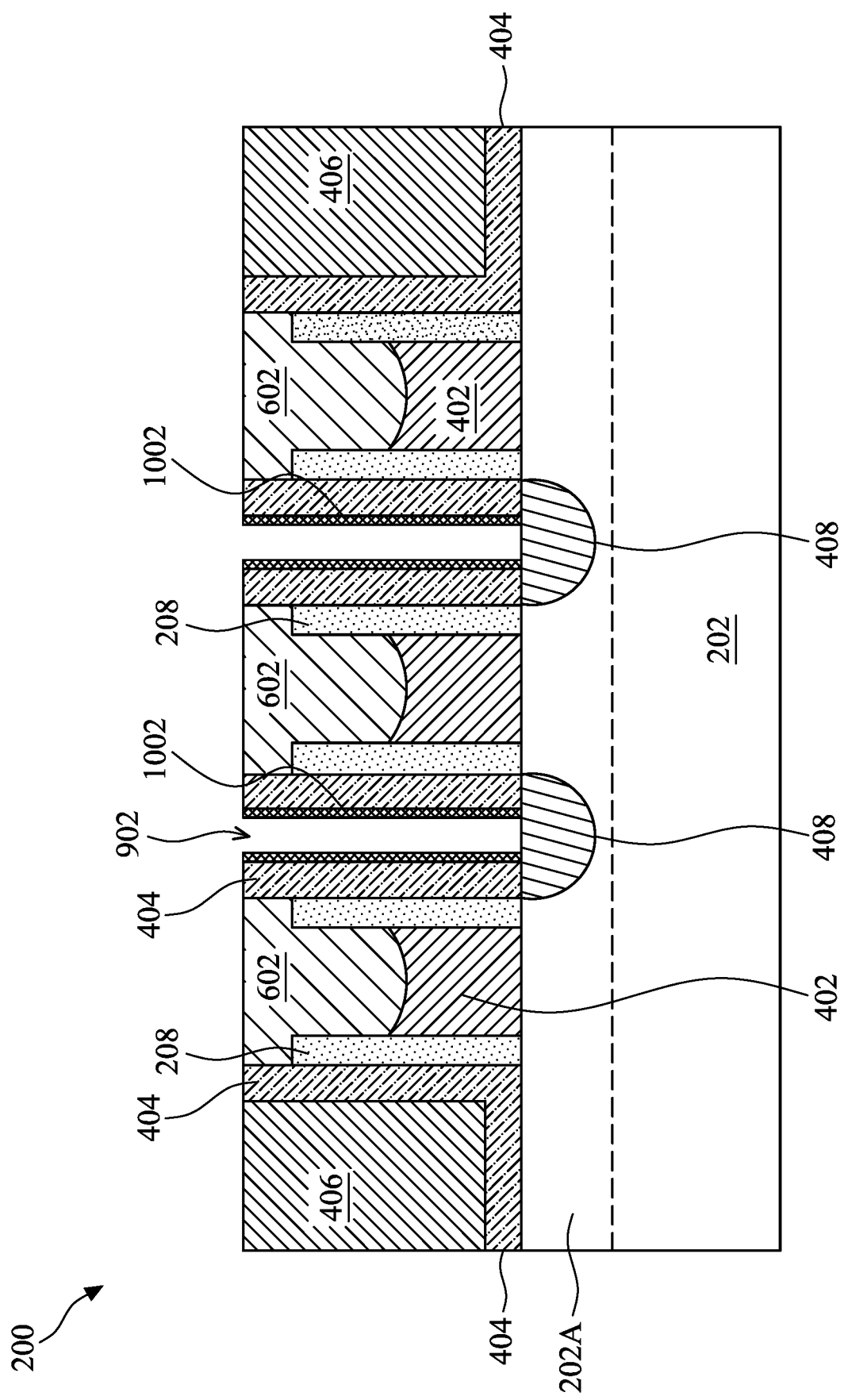
Figure 11B:
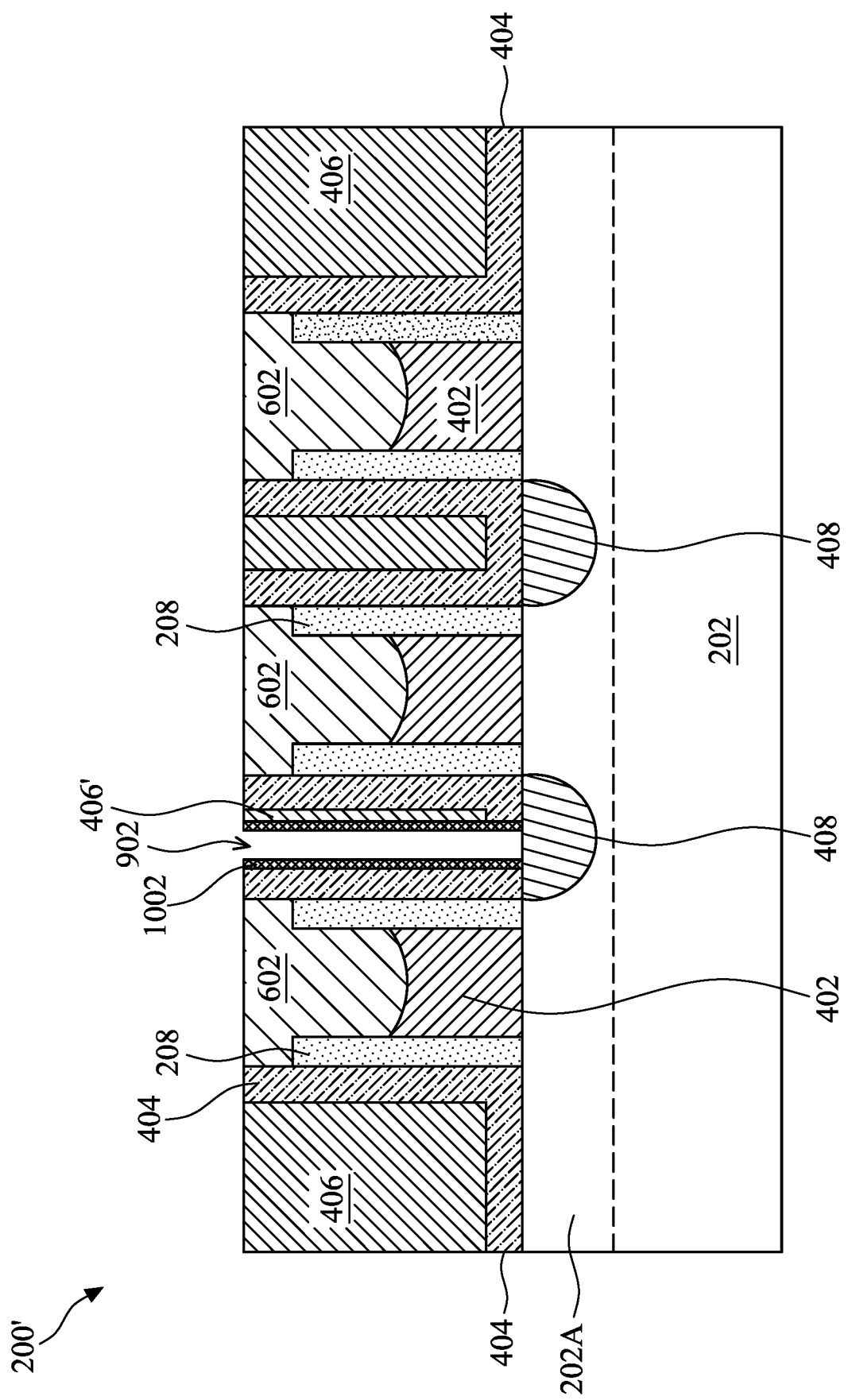

The method 100 then proceeds to block 114 where a dummy film is deposited over the substrate, including in the source/drain contact openings provided by block 112. Referring to the example of FIG. 10A, a dummy layer 1002 is formed over the substrate 202. In an embodiment, as illustrated in FIG. 10A, the dummy layer 1002 is deposited as a conformal layer. In an embodiment, the dummy layer 1002 is aluminum oxide. In an embodiment, the dummy layer 1002 is silicon. Other compositions for the dummy layer 1002 may also be possible such that they provide etch selectivity to the composition of the surrounding layers including a second dielectric layer 1200 (discussed below), the SAC layer 602, and/or CESL 404. In some embodiments, each of the second dielectric layer 1200, the SAC layer 602 and the CESL 404 are the same composition. The dummy layer 1002 may be deposited by CVD, ALD, or other suitable process. The thickness t1 of the dummy layer may be between approximately 0.5 nm and 4 nm. The thickness t1 is determinative of the subsequently formed air gap dimensions, which affect the device performance as discussed below.

The method 100 the proceeds to block 116 where the dummy film is etched removing it from the bottom of the source/drain contact opening and/or top surface of the device. Referring to the example of FIG. 11A, the dummy film 1002 is etched to remove the dummy film 1002 from the bottom of the opening 902 and the top of the device 200. The etching process may include a suitable dry etching process. The dummy film 1002 remains on the sidewalls of the openings 902 adjacent the CESL 404.

Figure 12A:
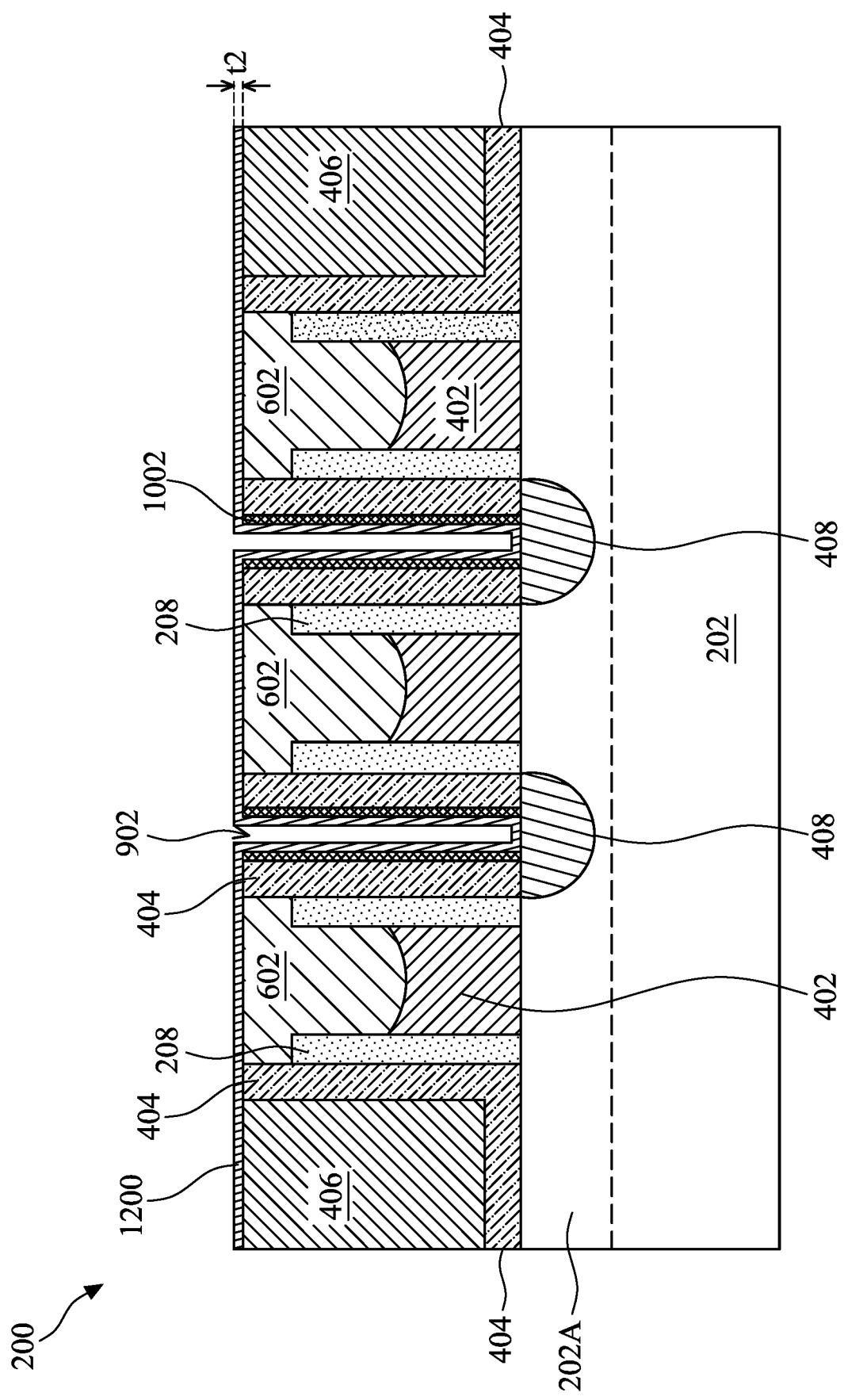
Figure 12B:
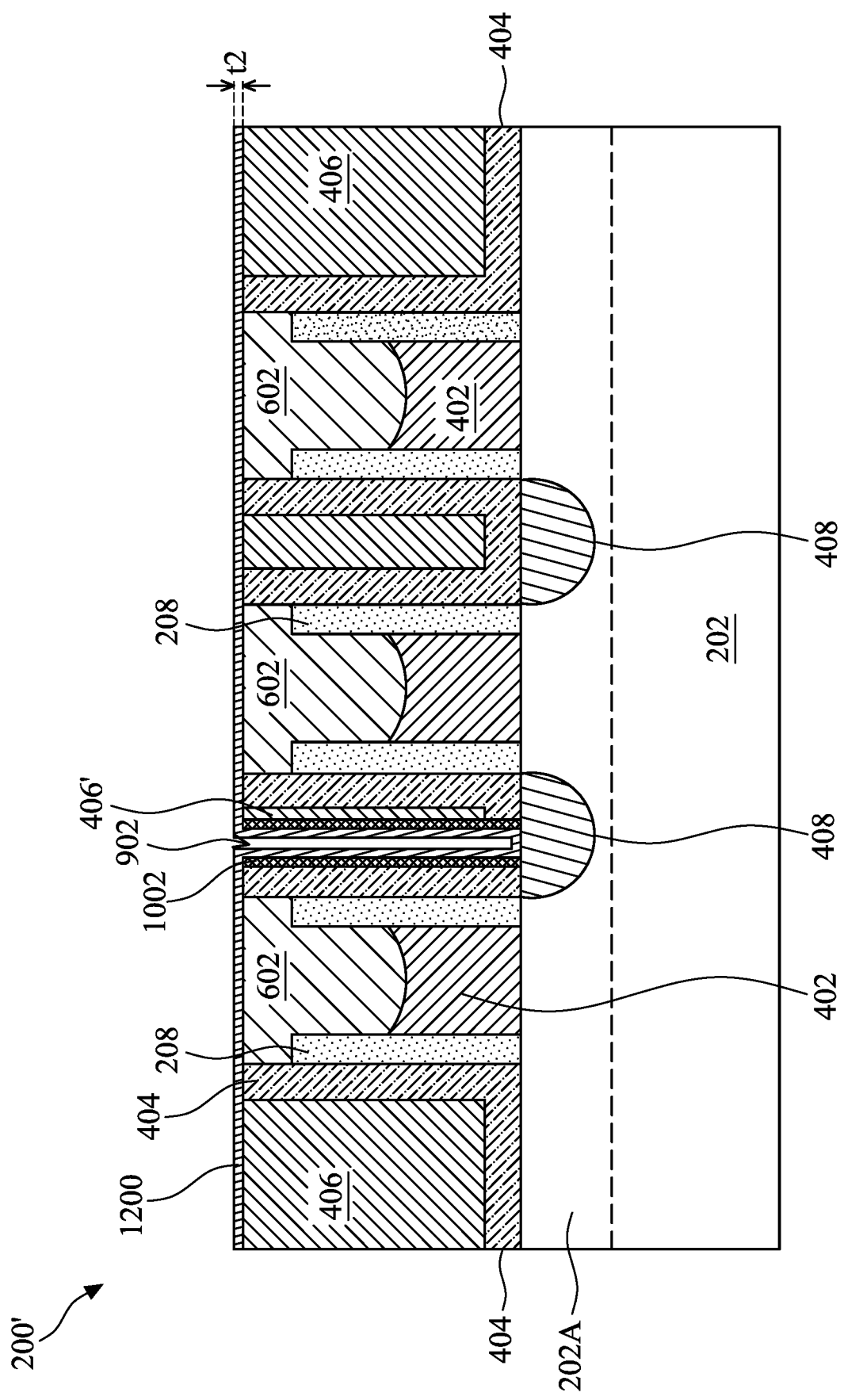
Figure 13A:
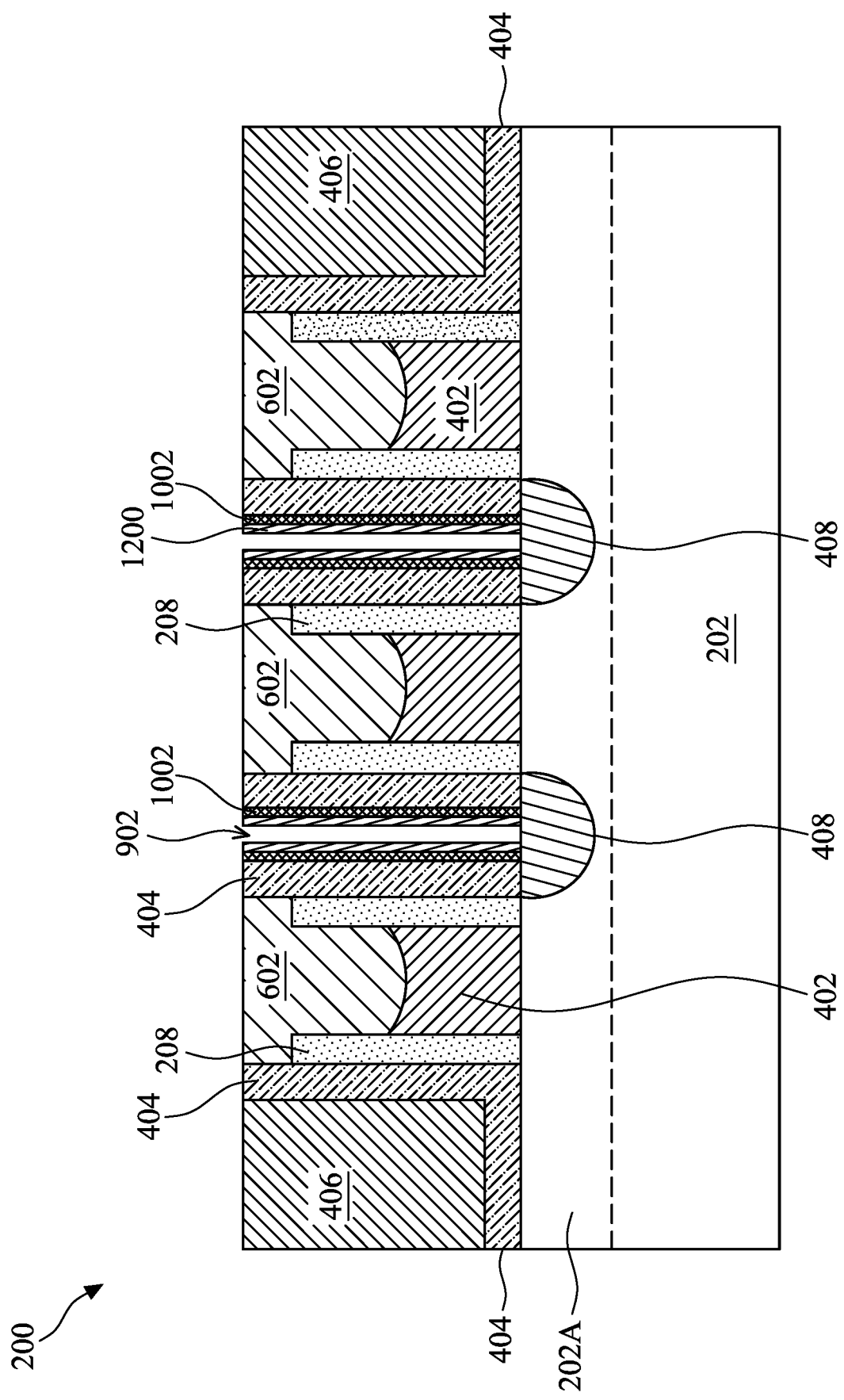
Figure 13B:
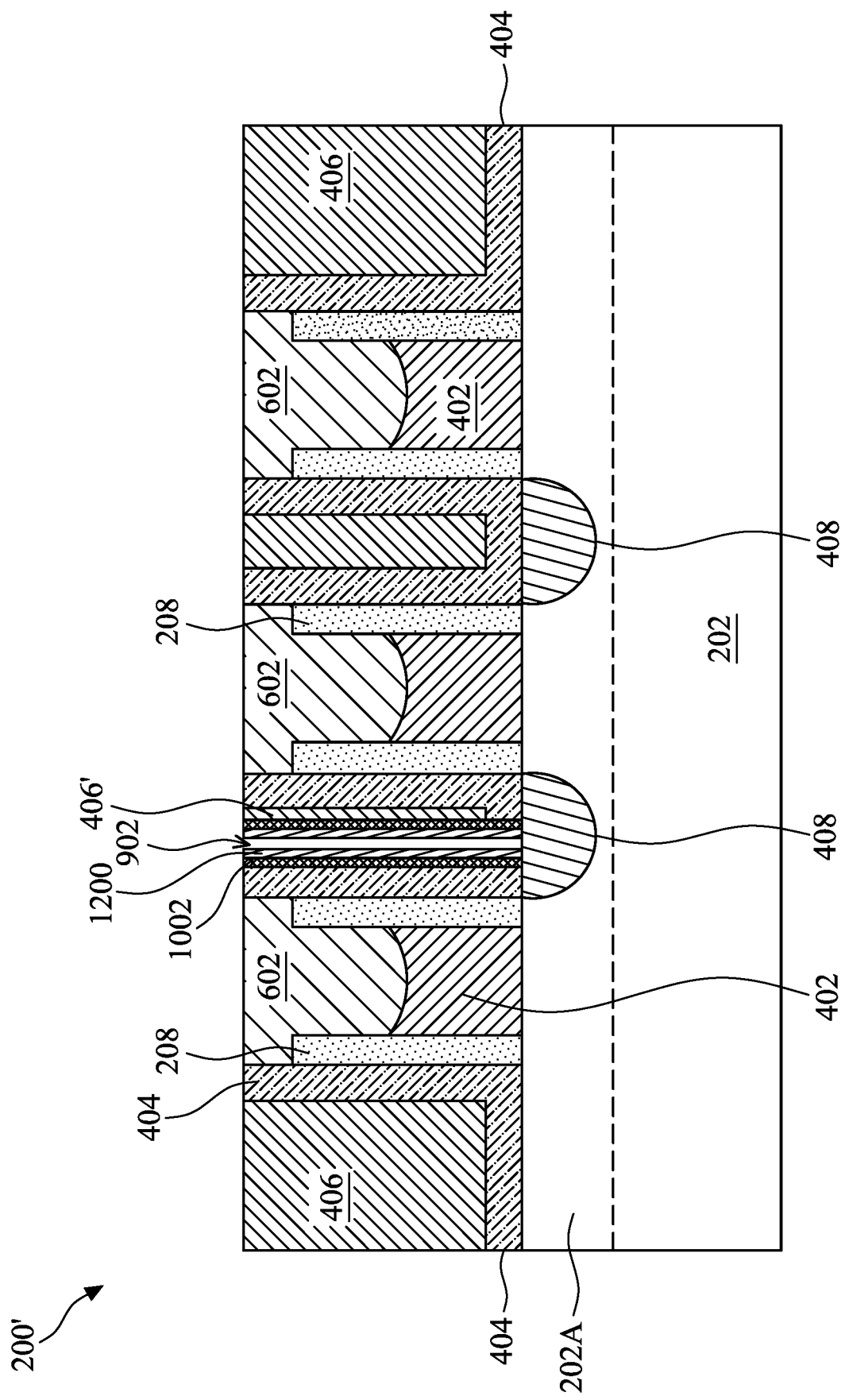
Figure 14A:
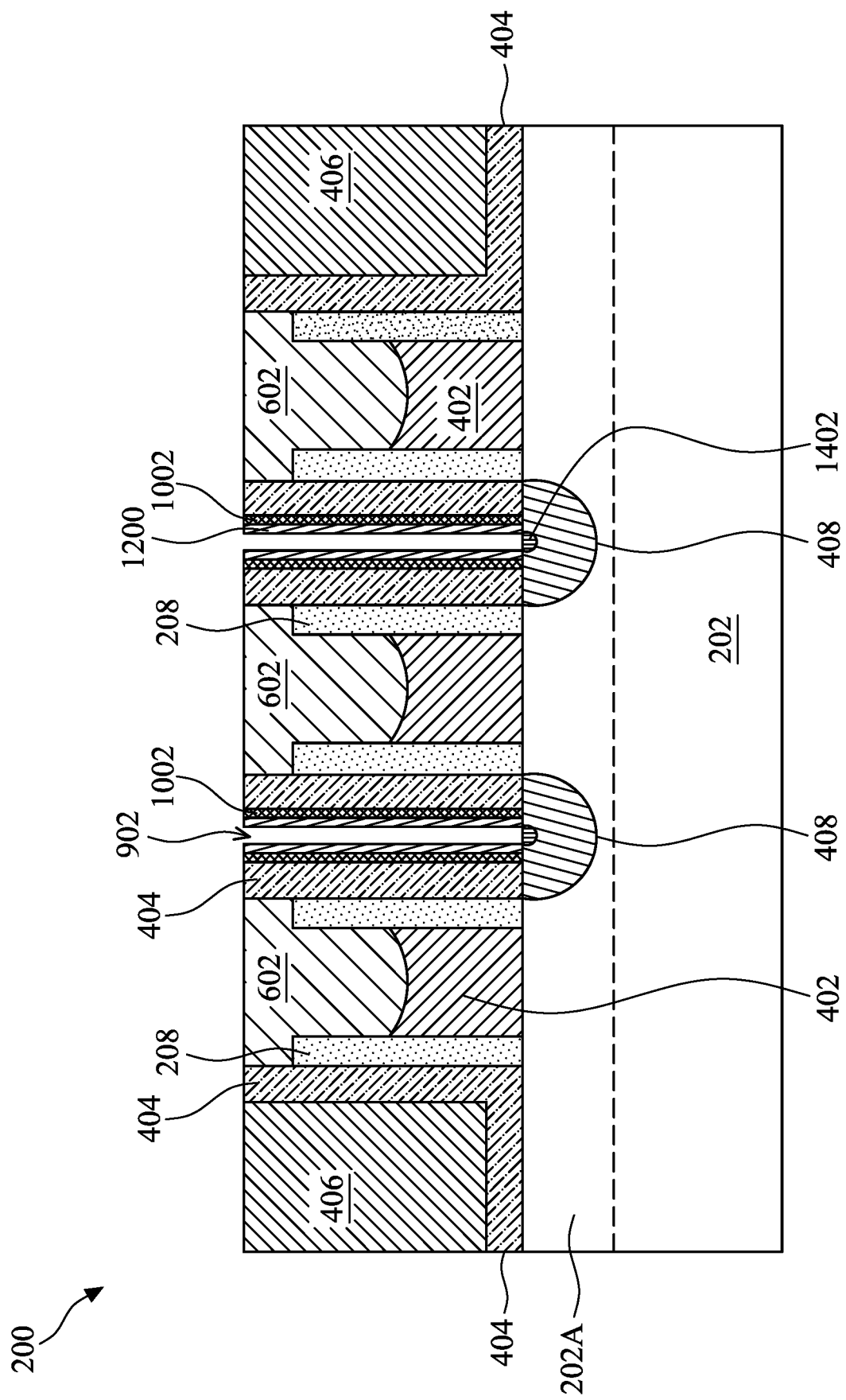
Figure 14B:
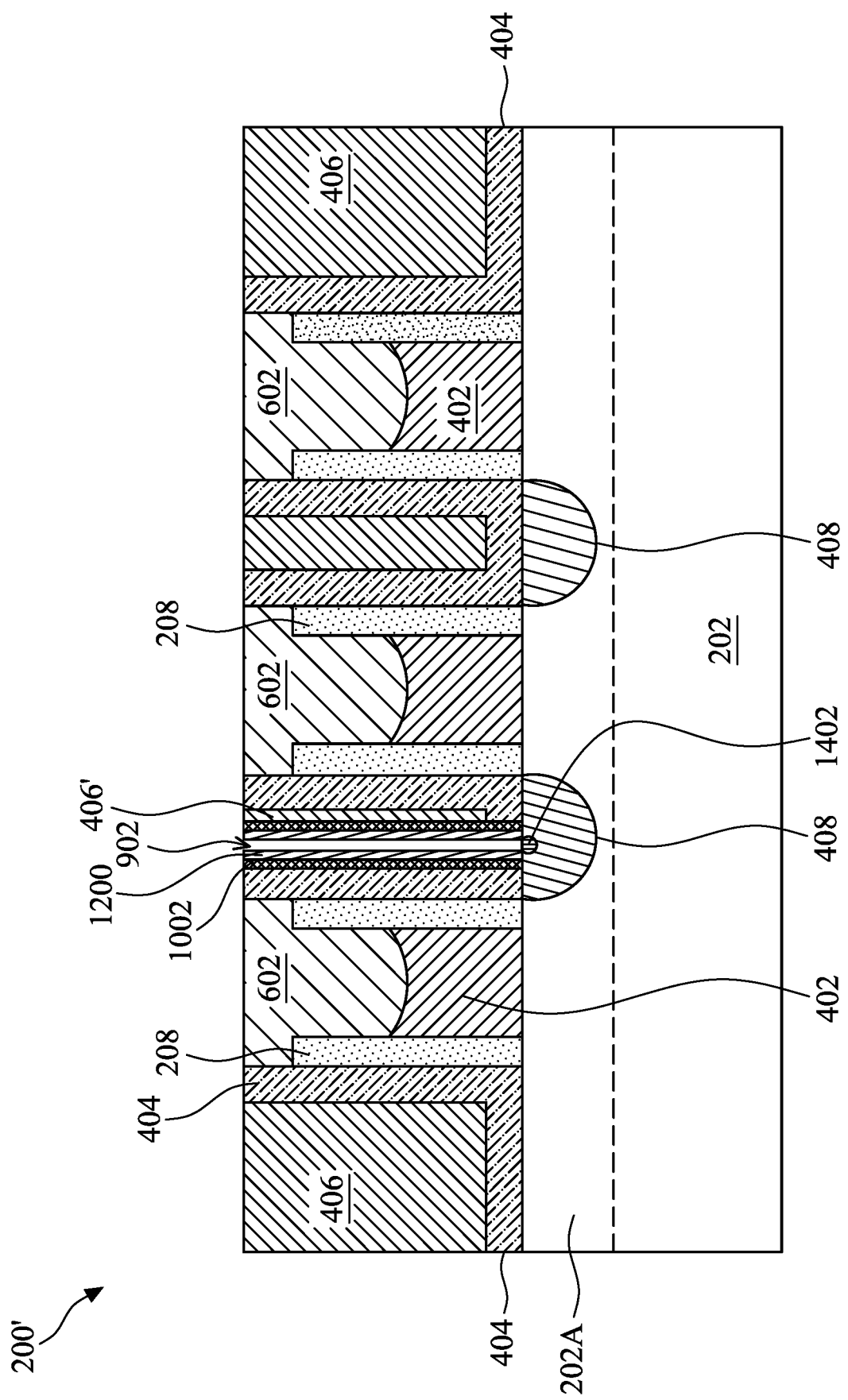
Figure 15A:
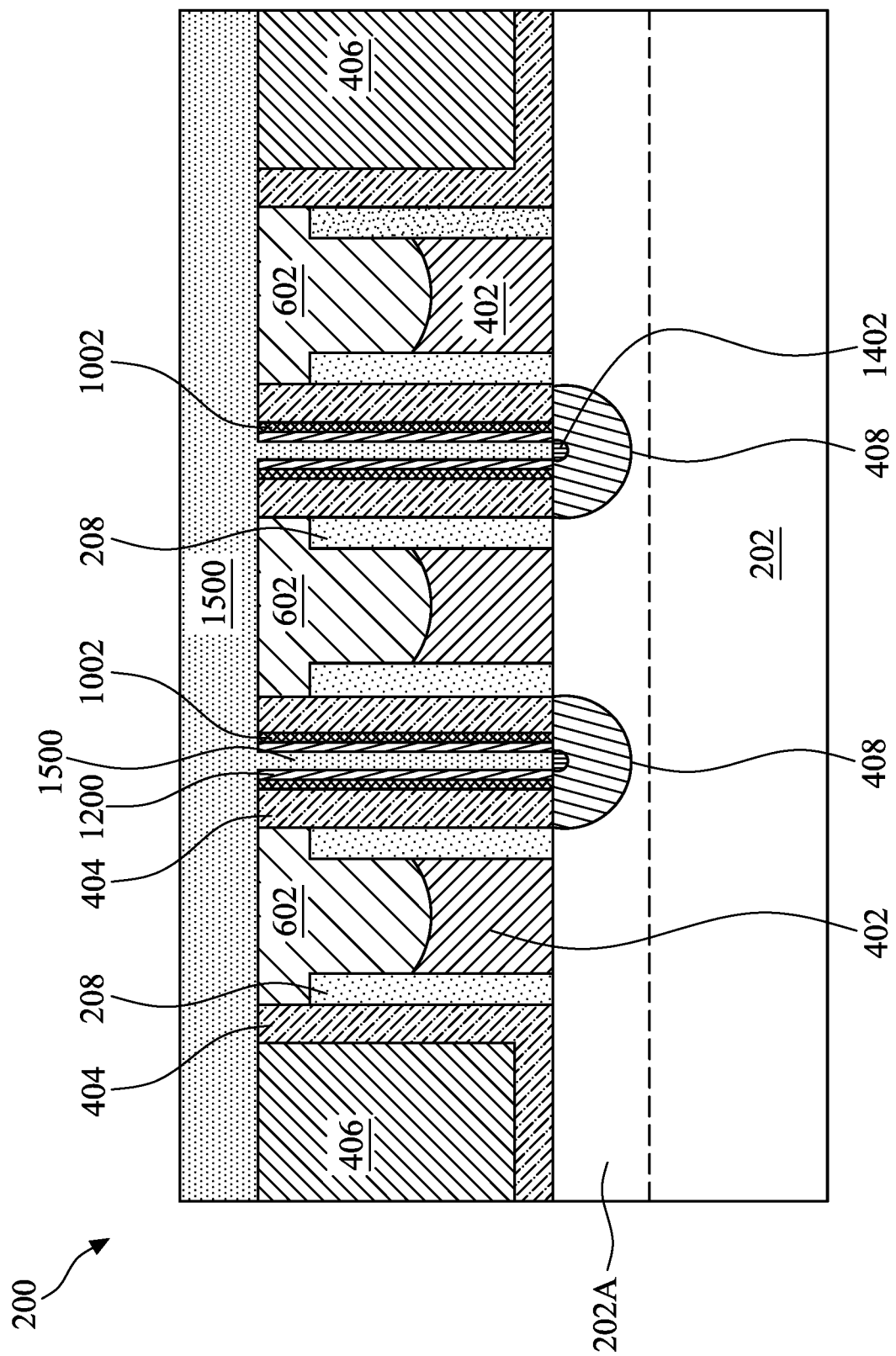
Figure 15B:
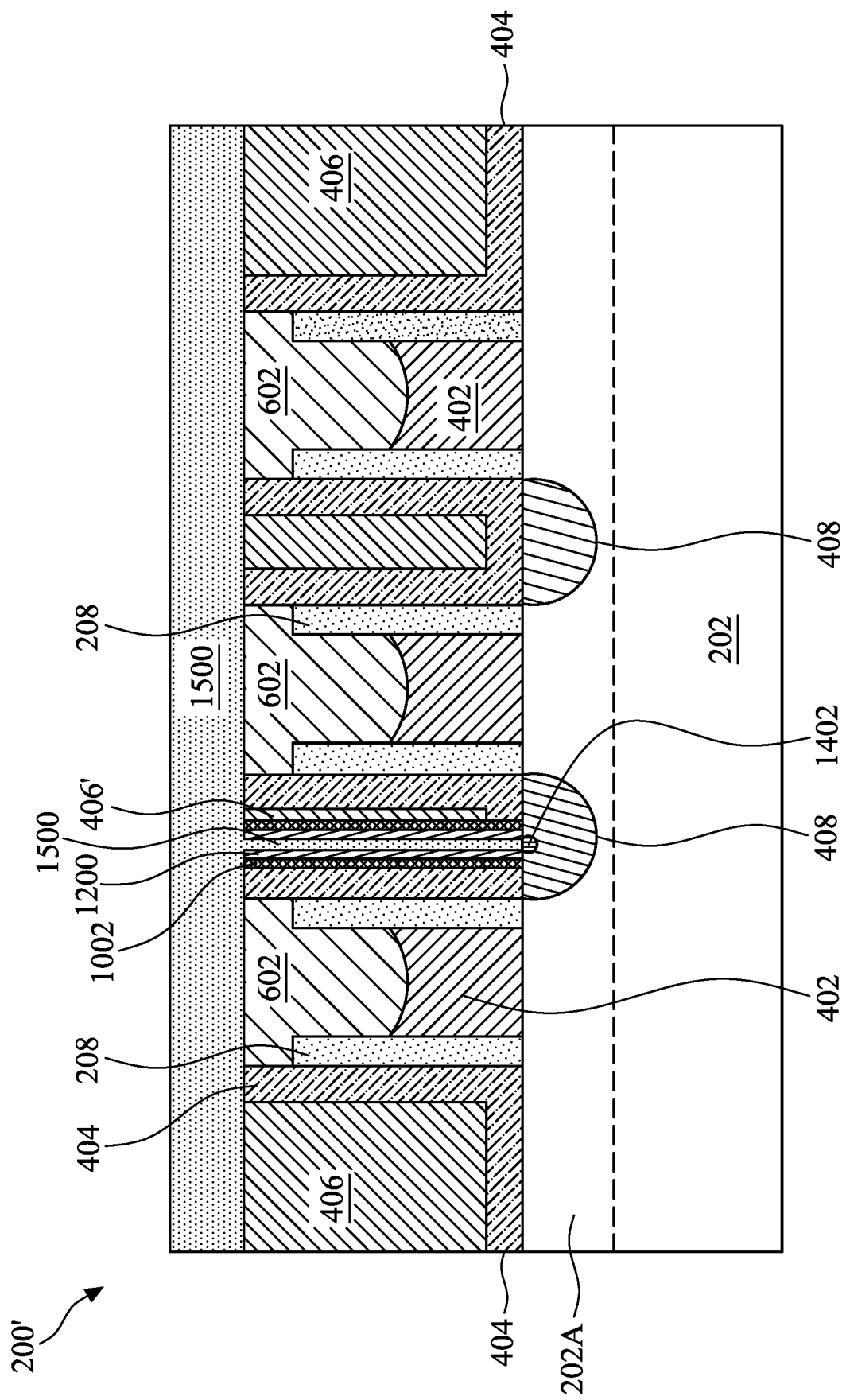
Figure 16A:
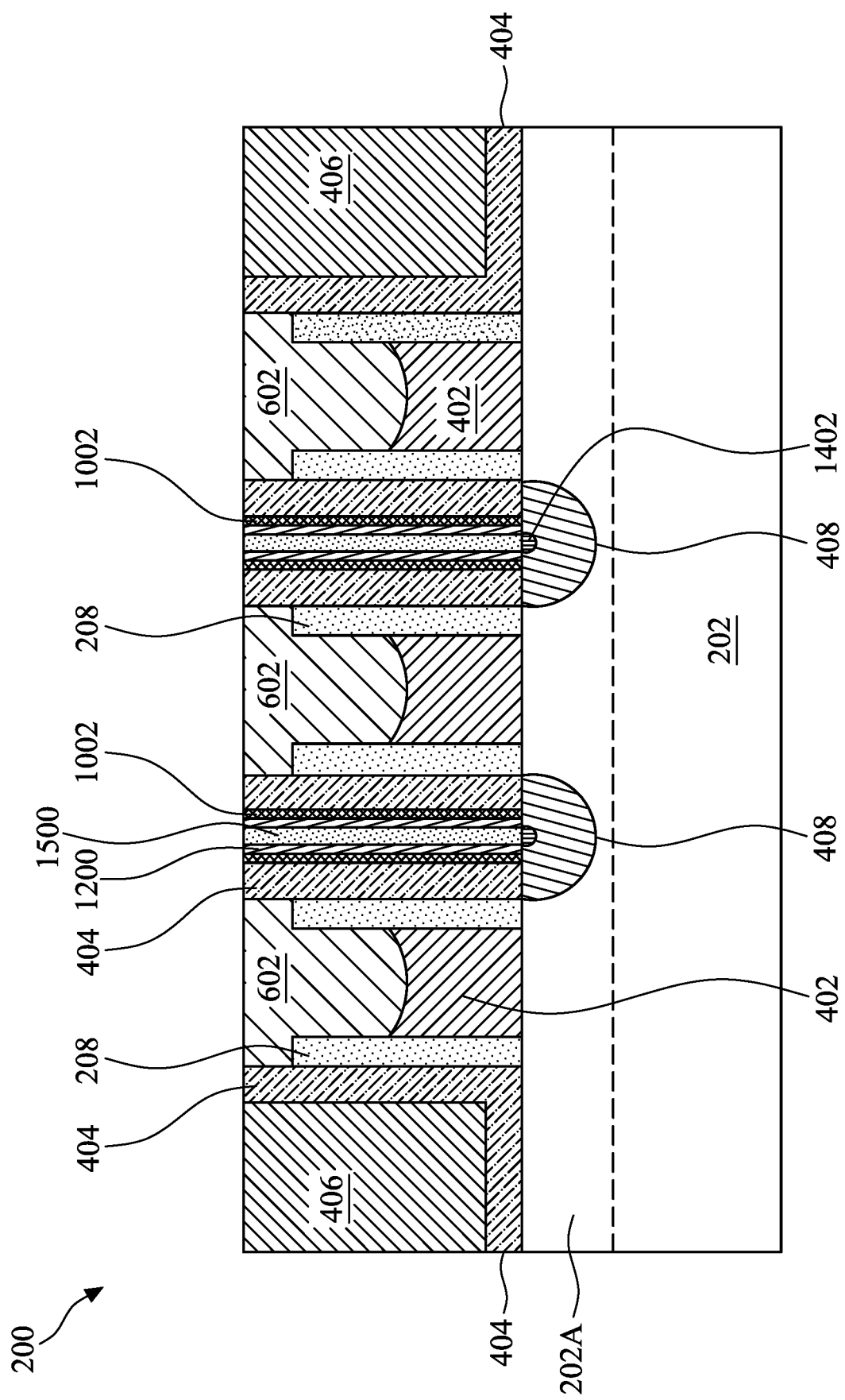
Figure 16B:
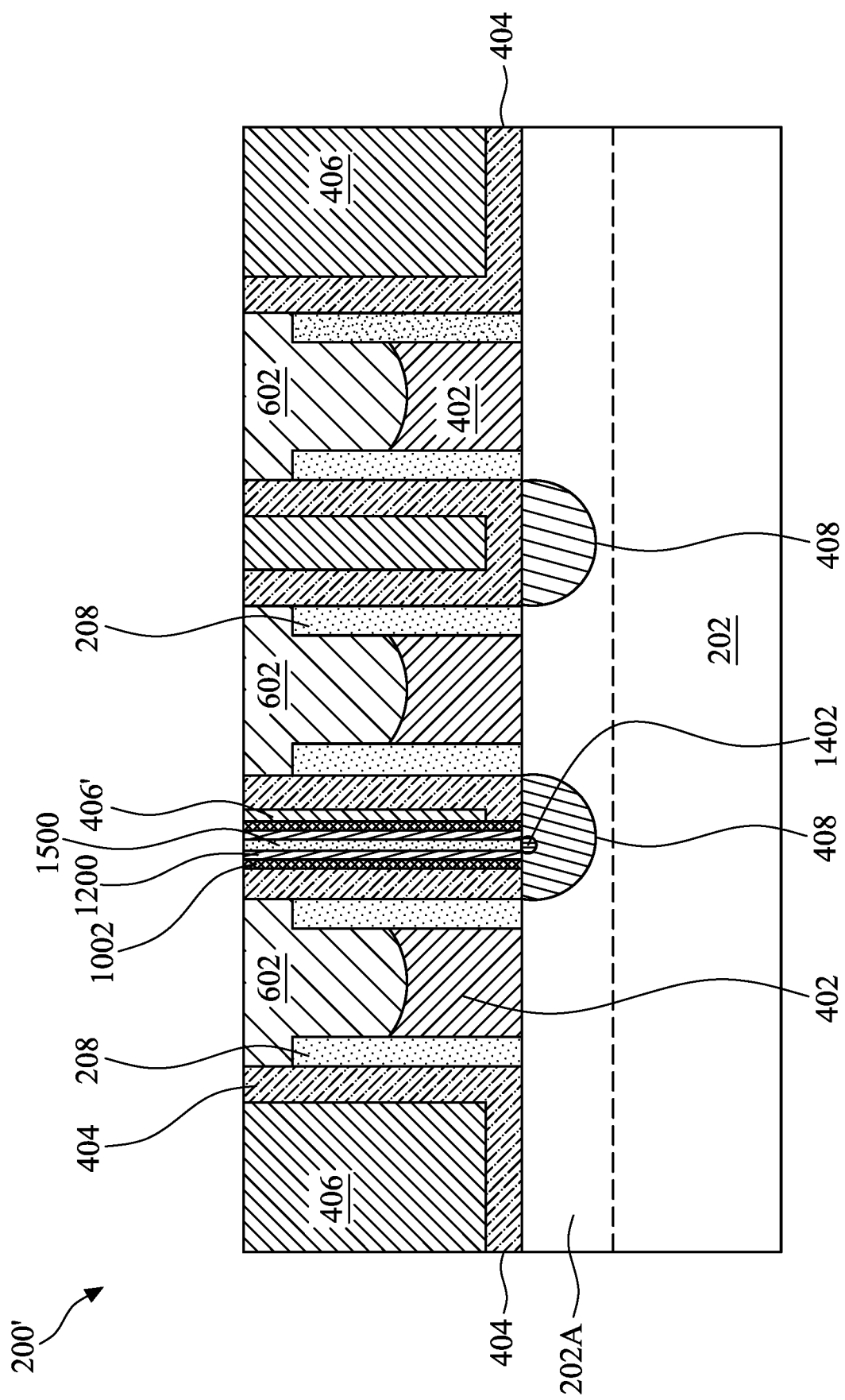

The method 100 then proceeds to block 118 where a second dielectric layer is formed over the dummy film including in the source/drain contact openings provided by block 112. Referring to the example of FIG. 12A, a second dielectric layer 1200 is formed over the substrate 202. In an embodiment, as illustrated in FIG. 12A, the second dielectric layer 1200 is deposited as a conformal layer. In an embodiment, the second dielectric layer 1200 is silicon nitride. Other exemplary compositions for the second dielectric layer include silicon oxide, a silicon oxynitride, and/or other materials known in the art and providing etch selectivity to the dummy film 1002. The second dielectric layer may be deposited by CVD, ALD, or other suitable process. The thickness t2 of the second dielectric layer 1200 may be between approximately 0.5 nm and 5 nm. The thickness t2 should be sufficient to protect the subsequently formed conductive material 1500 from interaction with the adjacent air gap 1502, discussed below.

The method 100 the proceeds to block 120 where the second dielectric layer is etched removing it from the bottom of the source/drain contact opening and/or top surface of the device. Referring to the example of FIG. 13A, the second dielectric layer 1200 is etched to remove the second dielectric layer 1200 from the bottom of the opening 902 and the top of the device 200. The etching process may include a suitable dry etching process. The second dielectric layer 1200 remains adjacent the residual dummy layer 1002.

The method 100 then proceeds to block 122 where a silicide region is formed in and/or on the source/drain feature. Referring to the example of FIG. 14A, a silicide region 1402 is formed in the source/drain feature 408. The silicide region 1402 may serve to electrically couple the source/drain features 408 with the subsequently formed contact element 1600, discussed below. The silicide region 1402 may be formed by introducing a silicide precursor metal, such as nickel, cobalt and titanium, onto the source/drain feature 408. An anneal initiates a silicidation reaction between semiconductor (e.g., silicon) in the source/drain features and the metal silicide precursor. The silicidation reaction results in a silicide region 1402, such as nickel silicide, cobalt silicide or titanium silicide. The silicide region 1402 may reduce the contact resistance between the source/drain features 408 and the source/drain contacts discussed below. It is noted that the silicide region 1402 extends across the source/drain feature 408 substantially between the second dielectric layer 1200. In some embodiments, the silicide region 1402 does not extend under the second dielectric layers 1200 and the dummy film 1002.

The method 100 then proceeds to block 124 where a conductive material is deposited filling the contact opening. Referring to the example of FIG. 15A, a conductive material 1500 is deposited filling the contact openings 902 and extending to the silicide region 1402 of the source/drain features 408. The conductive material 1500 may be a multi-layer conductive material. Exemplary materials include tungsten, ruthenium, cobalt, copper, titanium, titanium nitride, tantalum, tantalum nitride, molybdenum, or nickel, may be deposited over the device 200, including within the source/drain contact openings 902.

The method 100 then proceeds to block 126 where a planarization process such as CMP is performed on the conductive material forming a contact element to the source/drain feature. Referring to the example of FIG. 16A, the device 200 is planarized by a suitable planarization technique such as CMP to provide a planar top surface thereby forming a contact element 1600, or plug, comprising conductive material 1500 extending to the source/drain feature 408. The contact element provides an electrical connection to the source/drain feature 408 via the silicide region 1402.

The method 100 then proceeds to block 128 where the dummy film is removed to form an air gap adjacent the contact element. The dummy film may be removed by a selective etch process such as wet etch or dry etch process targeting the material of the dummy film, while leaving the surrounding materials substantially unetched. Example etchants include argon (Ar), hydrogen-comprising etch gas (e.g., H2, $CH_4$), a fluorine-comprising etch gas (for example, $F_2$, $CH_3F$, $CH_2F_2$, $CHF_3$, $CF_4$, $C_2F_6$, $SF_6$, and/or $NF_3$) and/or other suitable etchants. Referring to the example of FIG. 17A, the dummy film 1002 has been removed. The removal of the dummy film 1002 forms air gap 1502. The second dielectric layer 1200 and the CESL 404 may be substantially unetched. In an embodiment, the air gap 1502 has a width of thickness t1, determined by the thickness of the dummy film 1002.

Figure 18A:
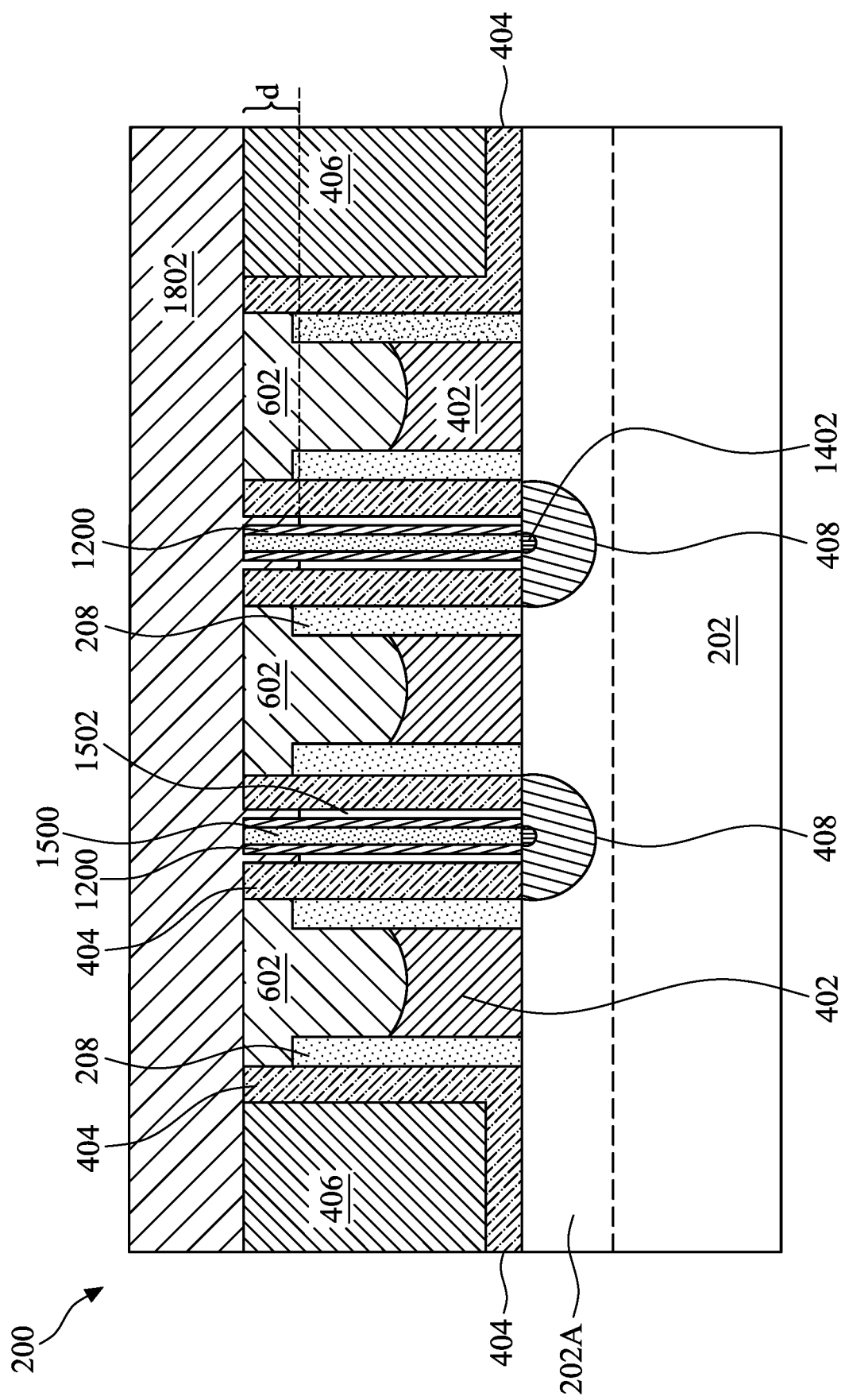

The method 100 then proceeds to block 130 where a second, or middle, contact etch stop layer (middle-CESL) is formed. The middle-CESL caps, or seals off, the air gap formed in block 128. Referring to the example of FIG. 18A, a middle-CESL 1802 is deposited on the device 200 and over the air gaps 1502. The CESL 1802 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In some implementations, the CESL 1802 may be deposited using CVD, ALD, or a suitable deposition method. In an embodiment, the CESL 1802 may have a thickness between approximately 10 nm and approximately 100 nm. It is noted that the deposition method and the thickness affect the distance the CESL 1802 extends into the air gap, illustrated as distance "d." The distance d may be between approximately 0 nm and approximately 5 nm. The distance d may be such that it does not extend to the gate structure 402 thereby preserving the air gap 1502 interposing the gate structure 402 and the contact element 1600. In contrast too thin of a thickness of the CESL 1802 can affect the quality of the seal of the air gap 1502.

The method 100 then proceeds to block 132 and further fabrication of the device. For example, additional dielectric layer(s) may be formed over the middle-CESL 1802 including those substantially similar to ILD 406. Further contact openings for conductive material to contact the gate structure may be formed including contacts extending through additional dielectric layer(s), the CESL 1802, and/or the first SAC dielectric material 602. The gate contact, like the source/drain contact may be formed of a conductive material, such as tungsten, ruthenium, cobalt, copper, titanium, titanium nitride, tantalum, tantalum nitride, molybdenum, or nickel. In some embodiments, a common gate contact is formed in two interconnected neighboring gate structures 402. The method 100 may continue to other further processes such as forming further structures for interconnecting devices (e.g., device 200) fabricated across the semiconductor substrate 202. For the example, such further processes may include deposition of an ILD layer, formation of metal lines, formation of power rails, and/or other suitable semiconductor device features.

Figure 17A:
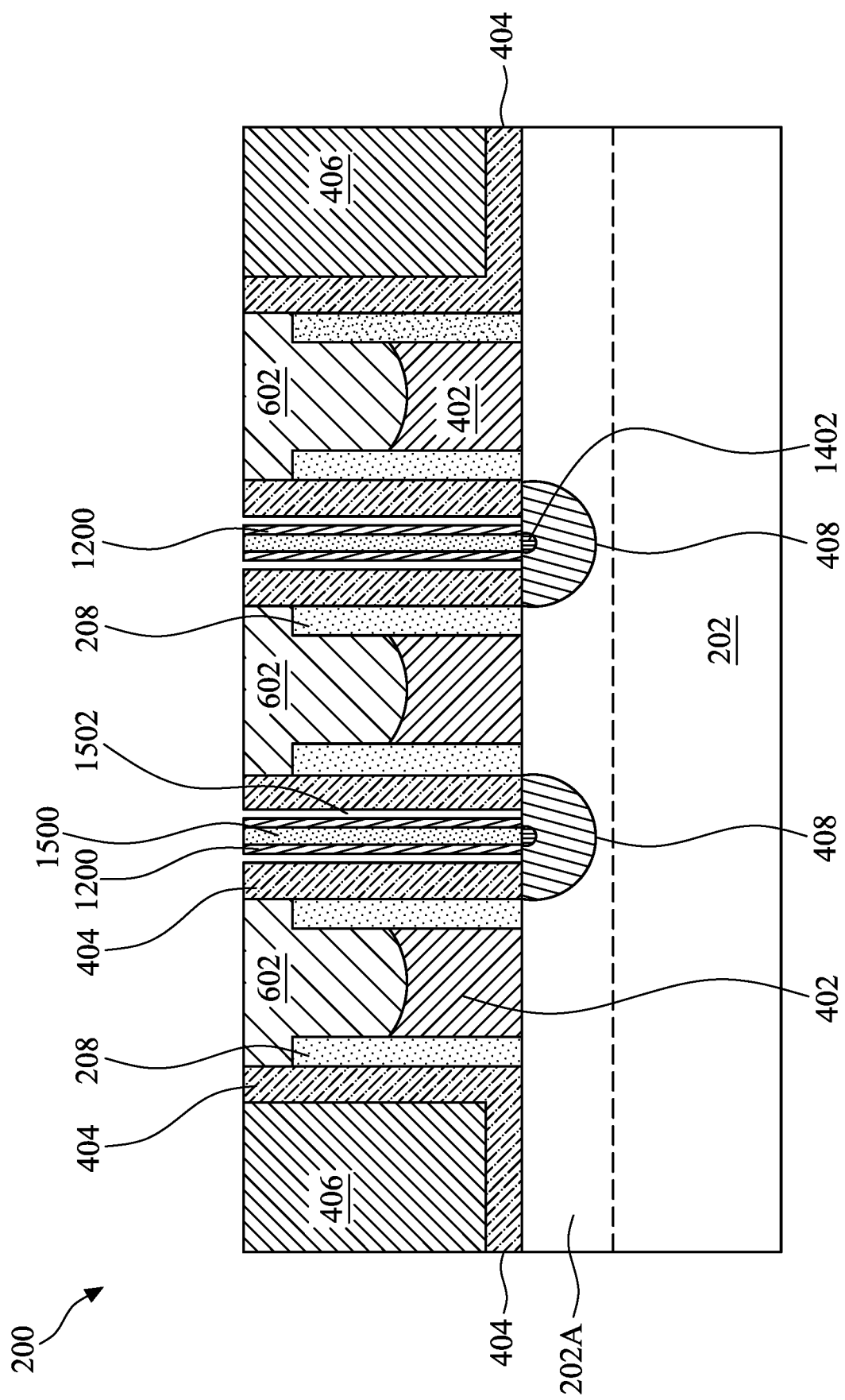
Figure 17B:
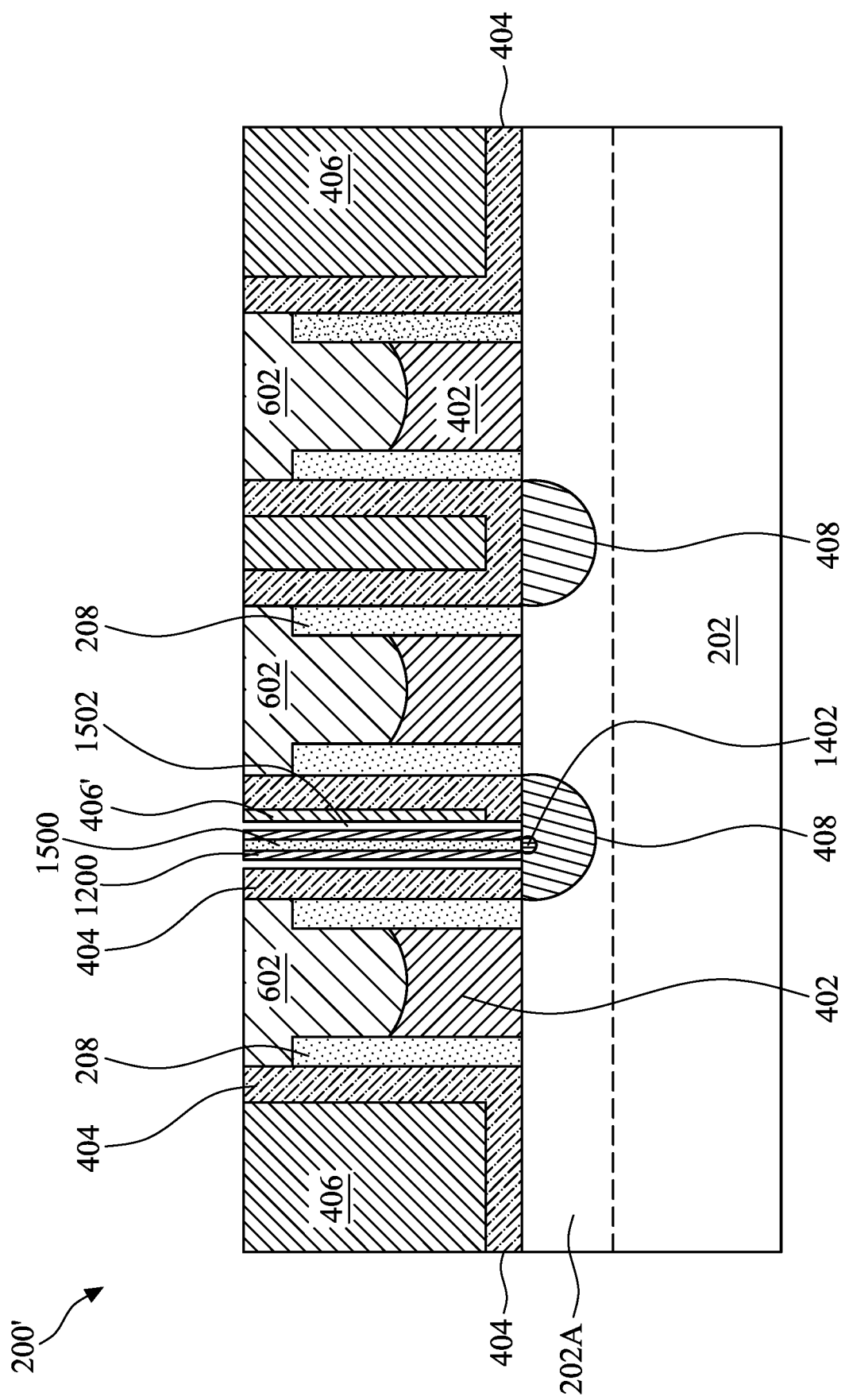
Figure 19:
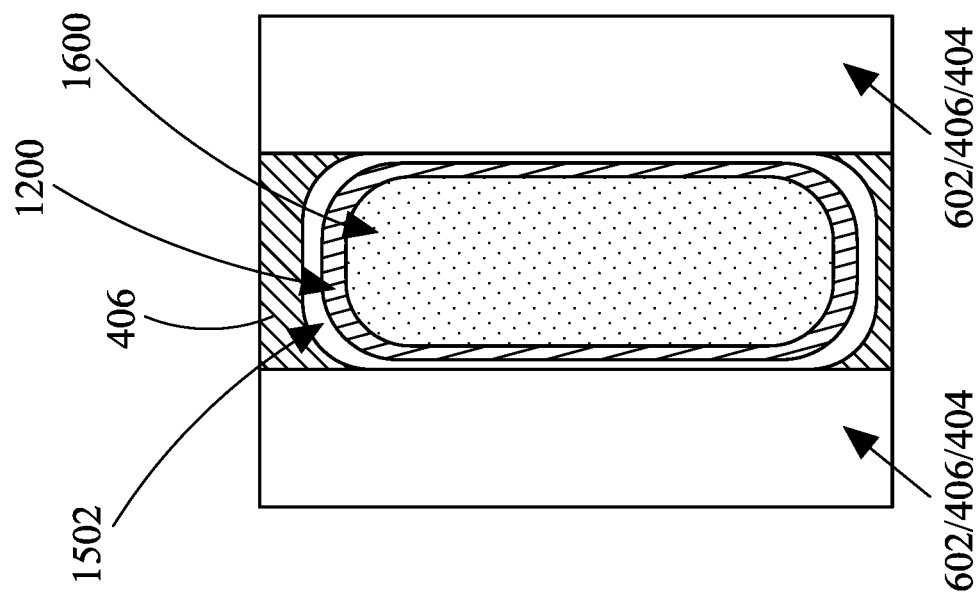
FIG. 19 is a top view of an embodiment of a semiconductor device corresponding to FIG. 18 in accordance with some embodiments.

FIG. 19 illustrates a corresponding top view of a portion of the device 200 of FIG. 17A. As illustrated in FIG. 19, in some embodiments, the air gap 1502 is formed such that it has a substantially uniform width around the source/drain contact element 1600.

Figure 8A:
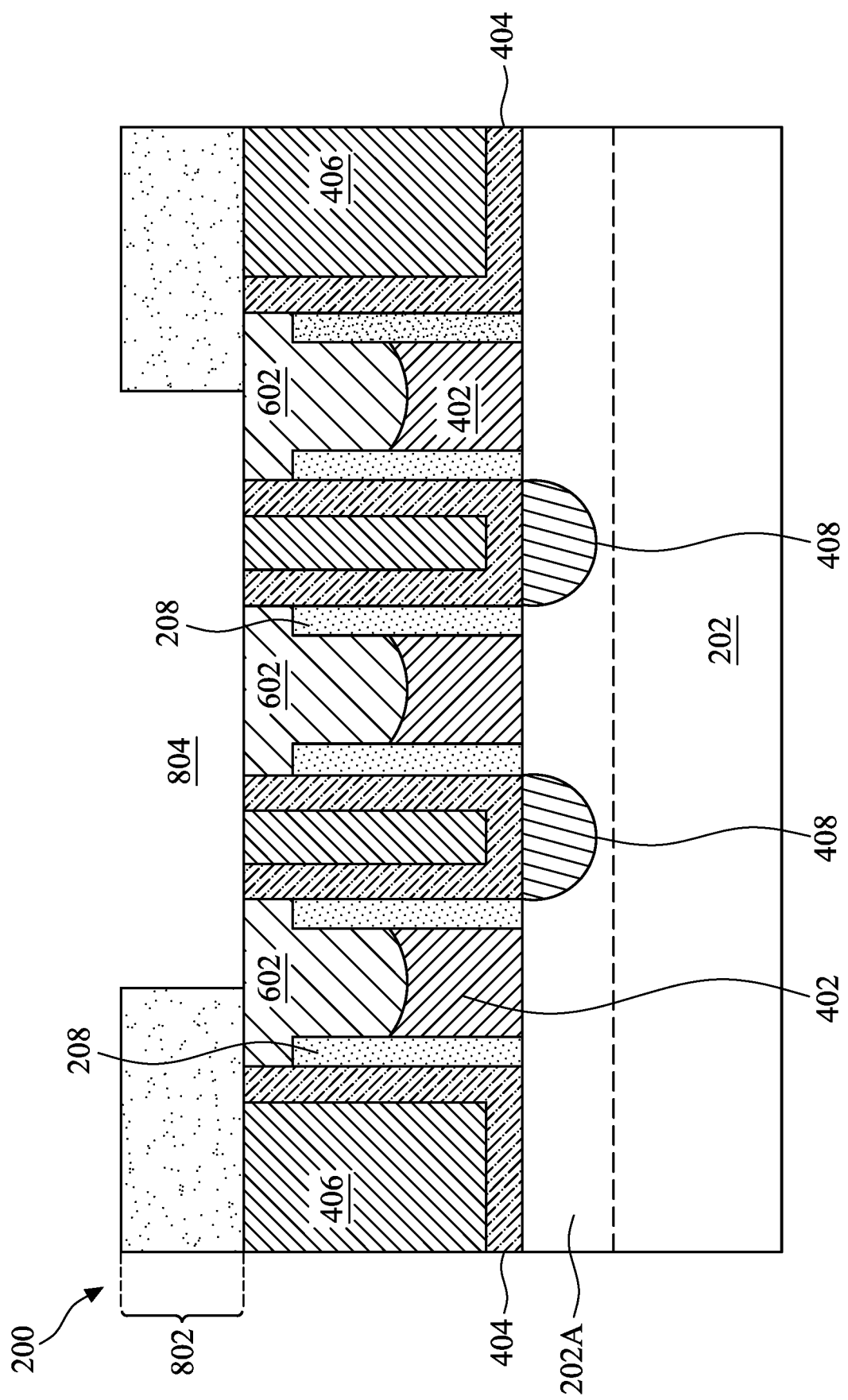
Figure 8B:
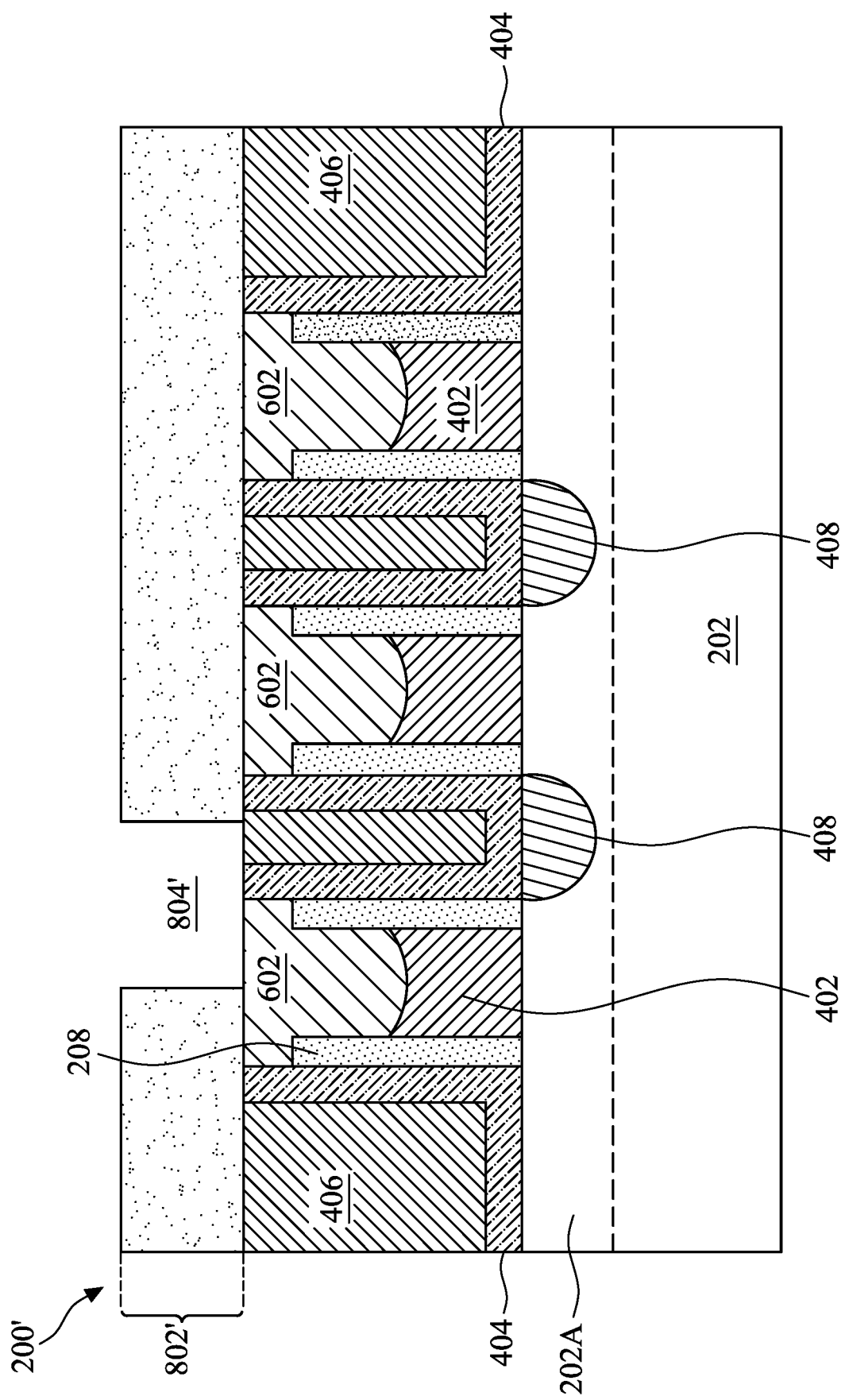
FIGS. 8B, 9B, 10B, 11B, 12B, 13B, 14B, 15B, 16B, 17B, and 18B are fragmentary cross-sectional views of an embodiment of another semiconductor device at various stages of fabrication according to the method in FIG. 1, according to one or more aspects of the present disclosure.

In another embodiment, a device 200' may be fabricated by the method 100. The device 200' may be substantially similar to as discussed above, except where noted herein. During block 112 of the method 100, the masking element 802 provides an opening 804 as discussed above with reference to the example of device 200. However, illustrated in FIG. 8B is an offset of the opening 804—illustrated as opening 804'—from alignment with the ILD 406 and CESL 404 that are to be removed to form the contact opening. This offset may result from challenges in process control due to shrinking geometries. Due to this offset, the opening 804' is formed. The opening 804' is substantially similar to the opening 804' discussed above, but being offset from specific alignment includes a sidewall of residual ILD material 406'. It is noted that because of the self-aligned capping layer 602 and the CESL 404, the selective etching to form the opening 804 does not impact the SAC layer 602 or the underlying gate structure 402.

Figure 18B:
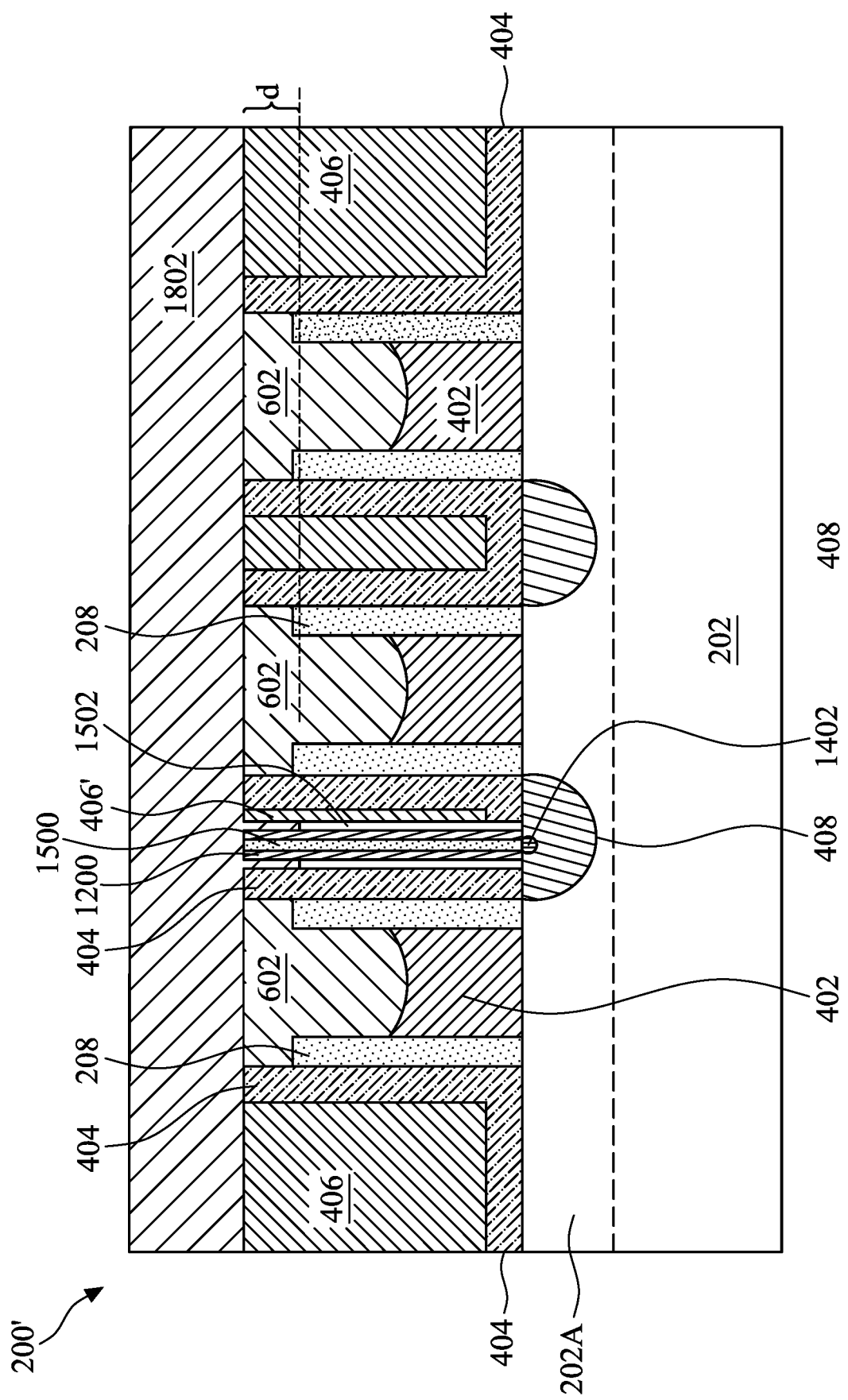

In the formation of the device 200', the method 100 continues from block 112 to perform additional processing steps as discussed above, which are illustrated as FIGS. 10B, 11B, 12B, 13B, 14B, 15B, 16B, 17B, and 18B respectively. The resultant device 200' as illustrated in FIG. 18B shows that abutting the air gap feature 1502, the residue of the ILD layer 406' may be provided. In other embodiments, the etchant used to remove the dummy layer 1002 is not selective to the residue 406' and it may also be removed in whole or in part during the etching of block 128 providing the air gap 1502 of FIG. 17B.

Referring now to FIG. 20, illustrated is an embodiment that may be fabricated according to one or more steps of the method 100. The exemplary gate all around (GAA) device 200" provides for the air gap 1502 interposing the CESL 404 and the second dielectric layer 1200 abutting the conductive contact 1500. The elements of FIG. 20 including the air gap 1502, CESL 404, second dielectric layer 1200, SAC 602, gate structure 402, source/drain feature 408 and substrate 202 may be substantially similar to as discussed above. In the GAA configuration illustrated, the gate structure 402 (including a high-k gate dielectric, interfacial layer, and gate electrode) wraps around channel layers 2002. In some embodiments, the channel layers 2002 are silicon. The channel layers 2002 may be referred to as nanowires, nanosheets, nanobars, and/or other suitable nanostructures. Inner spacers 2004 interpose the gate structure 402 and the source/drain features 408. The inner spacers 2004 may include one or more dielectric layers.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include providing an air gap between the contact to the source/drain feature and the metal gate structure that allows for a reduction in the parasitic capacitance of the device. Specifically, the parasitic capacitance between the metal gate structure and the source/drain contact feature is reduced due to the dielectric constant providing by the air gap. This in turn may lead to device performance improvement. The methods for forming the air gap provide for contact profile control while forming the air gap including through selective etch and deposition processes. Further, some embodiments provide for sufficient spacing between structures to allow the air gap to formed despite the aggressive pitch of the devices. Several aspects of the method can contribute to this spacing including thinning down of the spacer elements and/or performing deposition and etch processes of the layers interposing the gate and contact after the SAC dielectric material etch. Additional embodiments and advantages will be evident to those skilled in the art in possession of this disclosure.

Thus, one of the embodiments of the present disclosure provides a method of fabricating a semiconductor device. The method includes forming a gate structure and a source/drain region on a semiconductor substrate. The gate structure is recessed to form a first recess above a remaining gate structure. A first dielectric material is deposited in the first recess. After depositing the first dielectric material, a second recess is formed above the source/drain region. A dummy film is formed on sidewalls of the second recess and a second dielectric layer is formed on the dummy film. A remaining portion of the second recess is filled with a conductive material. The dummy film can be removed to form an air gap between the conductive material and the remaining gate structure.

In a further embodiment of the method, forming the second recess includes selectively etching an inter layer dielectric (ILD) layer over the source/drain region. In some example, a silicon nitride layer is also provided between the gate structure and the air gap. In a further embodiment, forming the dummy film includes depositing a conformal layer of a dummy film material and etching the conformal layer of the dummy film material to remove the dummy film material from a bottom of the second recess prior to forming the second dielectric layer. Similarly, in an embodiment, forming the second dielectric layer includes depositing a conformal layer of a second dielectric material and etching the conformal layer of the second dielectric material to remove the second dielectric material from a bottom of the second recess prior to filling the remaining portion.

In an embodiment, the forming the dummy film includes depositing at least one of aluminum oxide or silicon. In an example of the method, a contact etch stop layer (CESL) is deposited over the air gap. The CESL may fill a portion (e.g., upper portion) of the air gap. In an embodiment, after forming the second dielectric layer and prior to filling the remaining portion of the second recess with the conductive material, a portion of the source/drain region is silicided. In some embodiments of the method, the method includes providing spacer elements adjacent a dummy gate structure, reducing a thickness of the spacer elements, and after reducing the thickness, replacing the dummy gate structure with the gate structure.

In another of the broader elements, a method of fabricating a semiconductor device includes providing a substrate having a source/drain feature and an interlayer dielectric (ILD) layer formed over the source/drain feature. An opening is formed in the ILD layer exposing the source/drain feature. A dummy film is deposited over the ILD layer and within the opening. The method continues by etching the deposited dummy film to remove the dummy film from a bottom of the opening and a top surface of the ILD layer. A second dielectric layer is formed over the etched dummy film, which may then be etched to remove the second dielectric layer from the bottom of the opening and the top surface of the ILD layer. After etching the second dielectric layer, the opening is filled with a conductive material. The method continues to remove the etched dummy film to form an air gap.

In a further embodiment, the method also includes, after etching the second dielectric layer and before filling the opening, forming a silicide region on the source/drain feature. Filling the opening with conductive material may include providing the conductive material an interface with the silicide region. In an embodiment, a contact etch stop layer (CESL) is formed over the air gap. The CESL may interface with the air gap. In some embodiments, the CESL is also formed over the ILD layer and the second dielectric layer. In some examples of the method, the method includes providing a fin structure on the substrate; recessing at least a portion of the fin structure; and epitaxially growing the source/drain feature on the recessed portion of the fin structure.

The disclosure also provides embodiments of semiconductor devices including an embodiment semiconductor device that includes a metal gate structure disposed over a substrate, a source/drain feature adjacent the metal gate structure and a contact element extending to the source/drain feature. A first dielectric layer may be formed on sidewalls of the metal gate structure and a second dielectric layer surrounds the contact element. An air gap surrounds the dielectric layer.

In a further embodiment of the device, the air gap extends a first distance from a top surface of the substrate and the metal gate structure extends a second distance from the top surface of the substrate, the first distance being greater than the second distance. In an embodiment, the air gap has a first sidewall defined by the first dielectric layer and a second sidewall defined by the second dielectric layer. In some examples, the device further includes a contact etch stop layer disposed over the air gap, the metal gate structure, the second dielectric layer, and the contact element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming a gate structure and a source/drain region on a semiconductor substrate;
   recessing the gate structure to form a first recess above a remaining gate structure;
   depositing a first dielectric material in the first recess;
   after depositing the first dielectric material, forming a second recess above the source/drain region;
   forming a dummy film on sidewalls of the second recess, wherein the forming the dummy film includes:
      depositing a conformal layer of a dummy film material, and
      etching the conformal layer of the dummy film material to remove the dummy film material from a bottom of the second recess;
   forming a second dielectric layer on the dummy film after removing the dummy film material from the bottom of the second recess;
   filling a remaining portion of the second recess with a conductive material; and
   removing the dummy film to form an air gap between the conductive material and the remaining gate structure.

2. The method of claim 1, wherein the forming the second recess includes selectively etching an inter-layer dielectric (ILD) layer over the source/drain region.

3. The method of claim 1, further comprising:
   providing a silicon nitride layer between the gate structure and the air gap.

4. The method of claim 1, wherein the depositing the dummy film material includes providing the dummy film material having a first composition with an etch selectivity to a second composition of the second dielectric layer.

5. The method of claim 1, wherein the forming the second dielectric layer includes:
   depositing a conformal layer of a second dielectric material, and
   etching the conformal layer of the second dielectric material to remove the second dielectric material from a bottom of the second recess prior to filling the remaining portion.

6. The method of claim 1, wherein the forming the dummy film includes depositing at least one of aluminum oxide or silicon.

7. The method of claim 1, further comprising:
   depositing a contact etch stop layer (CESL) over the air gap, wherein the CESL fills a portion of the air gap.

8. The method of claim 1, further comprising:
   after forming the second dielectric layer and prior to filling the remaining portion of the second recess with the conductive material, siliciding a portion of the source/drain region.

9. The method of claim 1, further comprising:
   providing spacer elements adjacent a dummy gate structure;
   reducing a thickness of the spacer elements; and
   after reducing the thickness, replacing the dummy gate structure with the gate structure.

10. A method of fabricating a semiconductor device, comprising:
    providing a substrate having a source/drain feature and an interlayer dielectric (ILD) layer formed thereover;
    forming an opening in the ILD layer exposing the source/drain feature;
    depositing a dummy film over the ILD layer and within the opening;
    etching the deposited dummy film to remove the dummy film from a bottom of the opening and a top surface of the ILD layer;
    forming a second dielectric layer over the etched dummy film;
    etching the second dielectric layer to remove the second dielectric layer from the bottom of the opening and the top surface of the ILD layer; and
    after etching the second dielectric layer, filling the opening with a conductive material; and
    removing the etched dummy film to form an air gap; and
    forming a third dielectric layer over the air gap.

11. The method of claim 10, further comprising:

after etching the second dielectric layer and before filling the opening, forming a silicide region on the source/drain feature.

12. The method of claim 11, wherein the filling the opening includes providing the conductive material an interface with the silicide region.

13. The method of claim 10, wherein the forming the third dielectric layer includes forming a contact etch stop layer (CESL) over a top of the air gap.

14. The method of claim 13, wherein the CESL interfaces a second portion of the air gap wherein the CESL fills a first portion of the air gap, the second portion of the air gap disposed below the first portion.

15. The method of claim 13, wherein the third dielectric layer is formed over the ILD layer and the second dielectric layer.

16. The method of claim 10, further comprising:
providing a fin structure on the substrate;
recessing at least a portion of the fin structure; and
epitaxially growing the source/drain feature on the recessed portion of the fin structure.

17. A method of fabricating a semiconductor device, comprising:
providing a substrate having a source/drain feature and a dielectric layer formed thereover;
forming an opening in the dielectric layer exposing the source/drain feature;
depositing a dummy film along sidewalls of the opening;
forming a second dielectric layer abutting the dummy film along the sidewalls of the opening;
after forming the second dielectric layer, exposing a surface of the source/drain feature, siliciding the surface of the source/drain feature to form a silicided portion, and filling the opening with a conductive material disposed over the silicided portion; and
removing the dummy film to form an air gap between the conductive material and the dielectric layer.

18. The method of claim 17, depositing a second dielectric material over the air gap, wherein a bottom portion of the formed air gap is maintained after the depositing the second dielectric layer and a top portion of the formed air gap is filled with the second dielectric material.

19. The method of claim 17, wherein the providing the substrate having the source/drain feature includes:
providing a fin structure extending from the substrate;
recessing at least a portion of the fin structure; and
epitaxially growing the source/drain feature on the recessed portion of the fin structure.

20. The method of claim 17, wherein the depositing the dummy film along sidewalls of the opening includes:
depositing a conformal layer of a dummy material; and
etching the dummy material from a bottom surface of the opening.

* * * * *